(12) United States Patent  (10) Patent No.: US 11,360,594 B2
An et al.                  (45) Date of Patent:     Jun. 14, 2022

(54) TOUCH DISPLAY DEVICE

(71) Applicant: LG Display Co., Ltd., Seoul (KR)

(72) Inventors: Su-Chang An, Seoul (KR); Jae-Gyun Lee, Paju-si (KR); Hyang-Myoung Gwon, Paju-si (KR); Deuk-Su Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/935,073

(22) Filed: Jul. 21, 2020

(65) Prior Publication Data
US 2021/0055816 A1    Feb. 25, 2021

(30) Foreign Application Priority Data

Aug. 19, 2019 (KR) .......................... 10-2019-0101201

(51) Int. Cl.
G09G 5/00      (2006.01)
G06F 3/041     (2006.01)
(Continued)

(52) U.S. Cl.
CPC ............ *G06F 3/0412* (2013.01); *G06F 3/044* (2013.01); *G06F 3/04164* (2019.05);
(Continued)

(58) Field of Classification Search
CPC .... G06F 3/0412; G06F 3/04164; G06F 3/044; G06F 3/047; G06F 2203/04112;
(Continued)

(56) References Cited

U.S. PATENT DOCUMENTS

2016/0147344 A1* 5/2016 Yuan ..................... G06F 3/0445
                                                        345/173
2016/0259444 A1  9/2016 Yang et al.
(Continued)

FOREIGN PATENT DOCUMENTS

CN        101937293 A      1/2011
CN        108920033 A     11/2018
(Continued)

OTHER PUBLICATIONS

Taiwanese Office Action dated Feb. 25, 2021 issued in Patent Application No. 109125322 with English Translation (9 pages).
(Continued)

*Primary Examiner* — Jennifer T Nguyen
(74) *Attorney, Agent, or Firm* — Polsinelli PC

(57) ABSTRACT

A touch display device includes a unit pixel disposed on a substrate, the unit pixel comprising a plurality of subpixels; a light-emitting element disposed at each of the plurality of subpixels; an encapsulation unit disposed on the light-emitting element; a plurality of touch electrodes disposed on the encapsulation unit; a touch line connected to each of the plurality of touch electrodes, the touch line extending through the touch electrode; and at least one redundant electrode spaced apart from the touch electrode, the redundant electrode being independently disposed in each of the plurality of touch electrodes, the redundant electrode being disposed in the unit pixel. The redundant electrode is disposed along the touch line, whereby it is possible to reduce parasitic capacitance formed between the touch line and the touch electrode.

26 Claims, 39 Drawing Sheets

(51) Int. Cl.
  *G06F 3/044* (2006.01)
  *H01L 27/32* (2006.01)
  *H01L 51/52* (2006.01)

(52) U.S. Cl.
  CPC ........ *H01L 27/323* (2013.01); *H01L 27/3246* (2013.01); *H01L 51/5253* (2013.01)

(58) Field of Classification Search
  CPC ............... H01L 27/323; H01L 27/3246; H01L 51/5253; G09G 3/3607; G02F 1/136286; G02F 1/13338; G02F 1/136209; G02F 1/134309
  USPC ........................................................ 345/173
  See application file for complete search history.

(56) References Cited

U.S. PATENT DOCUMENTS

| | | | |
|---|---|---|---|
| 2017/0249039 A1 | 8/2017 | Kim | |
| 2017/0364179 A1 | 12/2017 | Jung | |
| 2018/0033832 A1* | 2/2018 | Park | ................... G06F 3/04164 |
| 2018/0059855 A1* | 3/2018 | Gwon | ................... H01L 27/323 |
| 2018/0120994 A1* | 5/2018 | Yoo | ....................... G06F 3/0412 |
| 2018/0157354 A1* | 6/2018 | Blondin | ................ G06F 3/0443 |
| 2019/0155436 A1* | 5/2019 | Jin | ..................... G02F 1/134309 |
| 2020/0278571 A1* | 9/2020 | Kajita | ................... G06F 3/0412 |
| 2020/0310574 A1* | 10/2020 | Pan | ....................... G06F 3/0443 |

FOREIGN PATENT DOCUMENTS

| | | |
|---|---|---|
| CN | 108958541 A | 12/2018 |
| CN | 109976582 A | 7/2019 |
| EP | 3316103 | 5/2018 |
| JP | 2017-021797 A | 1/2017 |
| TW | 201814462 A | 4/2018 |
| TW | 201923530 A | 6/2019 |

OTHER PUBLICATIONS

Search Report dated Jan. 13, 2021 issued in European Patent Application No. 20191320.9 (12 pages).
Japanese Office Action dated Aug. 17, 2021 issued in corresponding Patent Application No. 2020-138120 (6 pages).

* cited by examiner

TOUCH DISPLAY DEVICE

CROSS-REFERENCE TO RELATED APPLICATION

This application claims the benefit of Korean Patent Application No. 10-2019-0101201, filed on Aug. 19, 2019, which is hereby incorporated by reference in its entirety.

BACKGROUND

Field of the Disclosure

The present disclosure relates to a display device, and more particularly to a touch display device capable of reducing parasitic capacitance formed between a touch line and a touch electrode.

Description of the Background

A touchscreen is an input device that allows a user to input a command by selecting one of instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of the touchscreen has increased, since the touchscreen is capable of replacing a separate input device that is connected to the display device for operation, such as a keyboard or a mouse.

The touchscreen includes a plurality of touch electrodes and a plurality of touch lines. The touch lines are disposed so as to overlap the touch electrodes even in a non-contact area in which the touch lines are not contacted with the touch electrodes. Consequently, parasitic capacitance formed between the touch line and the touch electrode is increased, whereby RC delay is increased and thus touch performance is deteriorated.

SUMMARY

Accordingly, the present disclosure is directed to a touch display device that substantially obviates one or more problems due to limitations and disadvantages of the related art.

The present disclosure is to provide a touch display device capable of reducing parasitic capacitance formed between a touch line and a touch electrode.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, a touch display device includes a unit pixel disposed on a substrate, the unit pixel comprising a plurality of subpixels; a light-emitting element disposed at each of the plurality of subpixels; an encapsulation unit disposed on the light-emitting element; a plurality of touch electrodes disposed on the encapsulation unit; a touch line connected to each of the plurality of touch electrodes, the touch line extending through the touch electrode; and at least one redundant electrode spaced apart from the touch electrode, the redundant electrode being independently disposed in each of the plurality of touch electrodes, the redundant electrode being disposed in the unit pixel. A touch display device comprising: a unit pixel disposed on a substrate, the unit pixel comprising a plurality of subpixels; a light-emitting element disposed at each of the plurality of subpixels; an encapsulation unit disposed on the light-emitting element; a touch electrode disposed on the encapsulation unit; a touch line connected to the touch electrode; and a redundant electrode disposed between touch electrodes so as to be spaced apart from the touch electrode, the redundant electrode being disposed along the touch line.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Hereinafter, aspects of the present disclosure will be described in detail with reference to the accompanying drawings.

Figure 1:
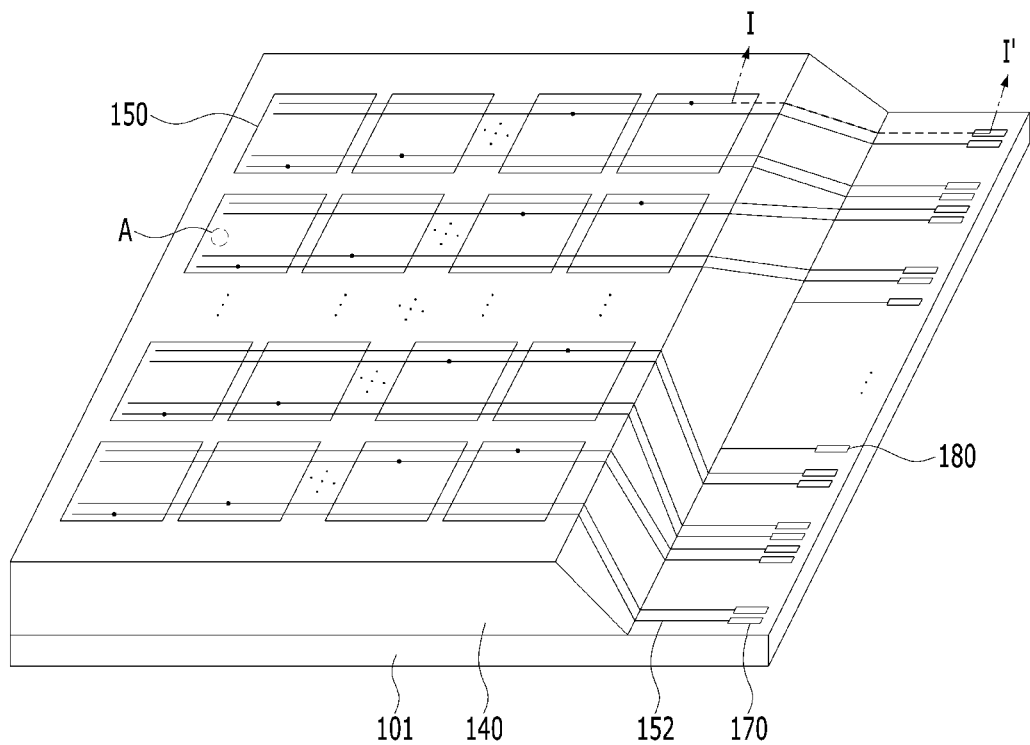
FIG. 1 is a perspective view showing a touch display device according to the present disclosure.
Figure 2:
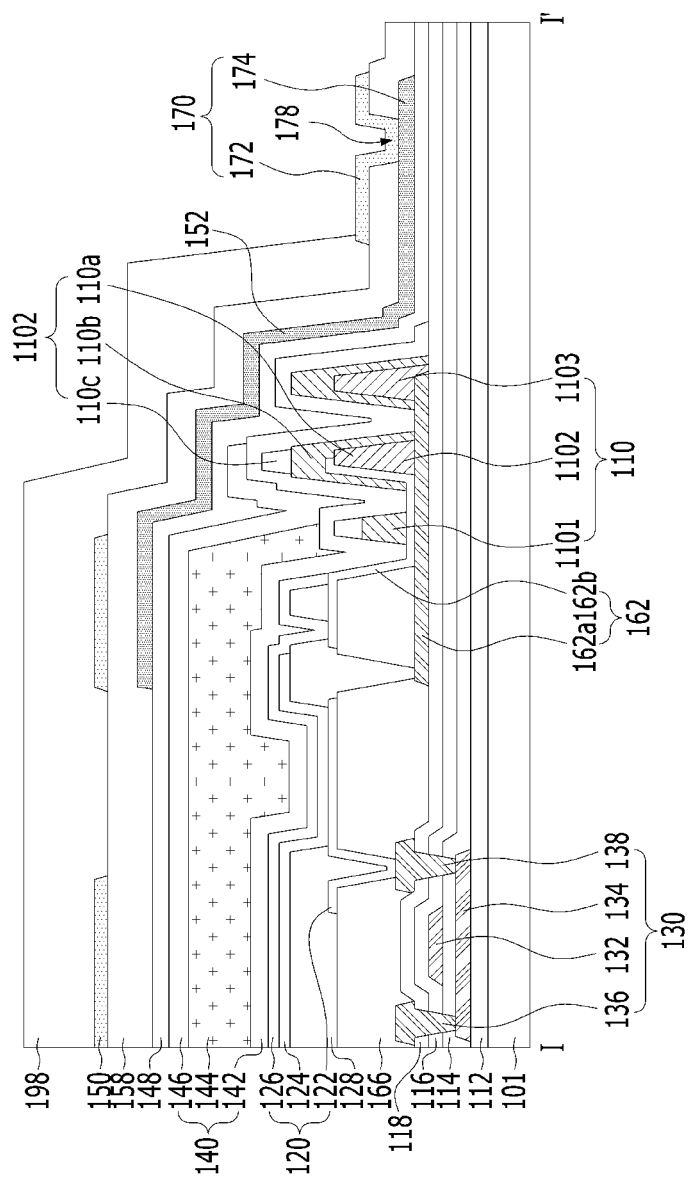
FIG. 2 is a cross-cross-sectional view of the touch display device taken along line I-I' of FIG. 1.

FIG. 1 is a perspective view showing a touch display device according to the present disclosure, and FIG. 2 is a cross-sectional view of the touch display device shown in FIG. 1.

The touch display device shown in FIGS. 1 and 2 performs a touch sensing function and a display function. That is, the touch display device displays an image through a unit pixel including subpixels arranged in a matrix, and performs the touch sensing function using a plurality of touch electrodes.

The touch display device includes a plurality of subpixels arranged on a substrate 101 in a matrix, an encapsulation unit 140 disposed on the plurality of subpixels, and touch electrodes 150 disposed on the encapsulation unit 140.

The substrate 101 is made of a plastic material or a glass material having flexibility so as to be foldable or bendable. For example, the substrate 101 may be made of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

Figure 3:
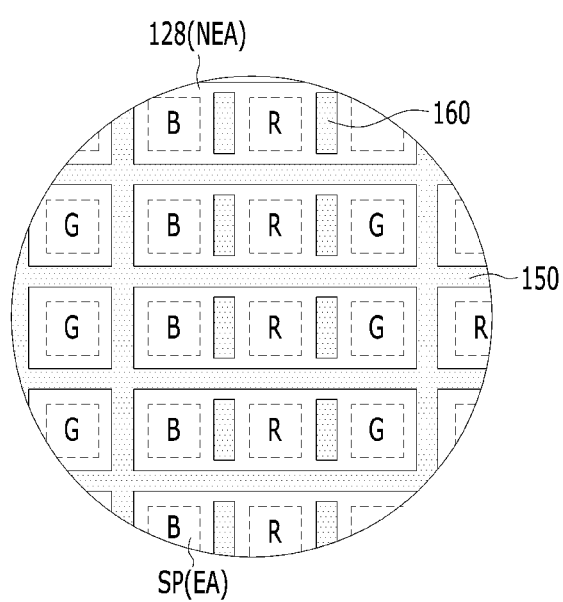
FIG. 3 is an enlarged plan view of area A of FIG. 1.

As shown in FIG. 3, the unit pixel includes at least three of a red (R), green (G), blue (B), and white (W) subpixel SP. As shown in FIG. 2, each of the plurality of subpixels includes a pixel drive circuit including a drive thin film transistor 130 and a light-emitting element 120 connected to the pixel drive circuit.

In response to a data signal supplied to a gate electrode of the drive thin film transistor 130 included in the pixel drive circuit, the drive thin film transistor 130 controls current that is supplied from a high-voltage (VDD) supply line to the light-emitting element 120 to adjust the amount of light emitted by the light-emitting element 120.

As shown in FIG. 2, the drive thin film transistor 130 includes a semiconductor layer 134 disposed on a buffer layer 112, a gate electrode 132 overlapping the semiconductor layer 134 in the state in which a gate dielectric film 114 is interposed therebetween, and source and drain electrodes 136 and 138 formed on at least one interlayer dielectric film 116 and 118 so as to contact the semiconductor layer 134. Here, the semiconductor layer 134 is made of at least one of an amorphous semiconductor material, a polycrystalline semiconductor material, and an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the drive thin film transistor 130 exposed through a pixel contact hole formed through the interlayer dielectric films 116 and 118 and a pixel planarization layer 166.

The at least one light-emitting stack 124 is formed on the anode 122 in an emission area defined by a bank 128. The at least one light-emitting stack 124 is formed by stacking a hole-related layer, an organic light-emitting layer, and an electron-related layer on the anode 122 in that order or in reverse order. In addition, the light-emitting stack 124 may include first and second light-emitting stacks that are opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image. Alternatively, each light-emitting stack 124 may generate colored light corresponding to each subpixel without a separate color filter in order to realize a color image. That is, the light-emitting stack 124 of the red subpixel may generate red light, the light-emitting stack 124 of the green subpixel may generate green light, and the light-emitting stack 124 of the blue subpixel may generate blue light.

The cathode 126 is formed so as to be opposite the anode 122 in the state in which the light-emitting stack 124 is disposed therebetween. The cathode 126 is connected to a low-voltage (VSS) supply line via first and second auxiliary electrodes 162a and 162b. The first auxiliary electrode 162a is made of the same material as the source and drain electrodes 136 and 138, and is disposed on the upper interlayer dielectric film 118. The first auxiliary electrode 162a is disposed on the upper interlayer dielectric film 118 so as to overlap at least one of a plurality of dams 110.

The second auxiliary electrode 162b is made of the same material as the anode 132, and is disposed on the pixel planarization layer 166. The second auxiliary electrode 162b is connected to the first auxiliary electrode 162a exposed between the pixel planarization layer 166 disposed at the outermost side and a first sub dam layer 110a of a second dam 1102. In this case, the second auxiliary electrode 162b is formed so as to extend along the upper surface and the side surface of the pixel planarization layer 166 disposed at the outermost side, the upper surface of the first auxiliary electrode 162a, and the side surface of the first sub dam layer 110a of the second dam 1102. In addition, the second auxiliary electrode 162b exposed between the banks 128 is connected to the cathode 126 on the pixel planarization layer 166.

The encapsulation unit 140 prevents external moisture or oxygen from permeating into the light-emitting element 120, which has low resistance to external moisture or oxygen. To this end, the encapsulation unit 140 includes at least one inorganic encapsulation layer 142 and at least one organic encapsulation layer 144. In the present disclosure, an encapsulation unit 140 having a structure in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 101 on which the cathode 126 is formed. The second inorganic encapsulation layer 146 is formed on the substrate 101 on which the organic encapsulation layer 144 is formed, and is formed so as to surround the upper surface, the lower surface, and the side surface of the organic encapsulation layer 144 together with the first inorganic encapsulation layer 142.

The first and second inorganic encapsulation layers 142 and 146 minimize or prevent external moisture or oxygen from permeating into the light-emitting stack 124. Each of the first and second inorganic encapsulation layers 142 and 146 is made of an inorganic dielectric material that can be deposited at a low temperature, such as silicon nitride ($SiN_x$), silicon oxide ($SiO^x$), silicon oxynitride (SiON), or aluminum oxide (Al2O3). Consequently, each of the first and second inorganic encapsulation layers 142 and 146 is deposited in a low-temperature atmosphere, whereby it is possible to prevent damage to the light-emitting stack 124, which has low resistance to a high-temperature atmosphere, when each of the first and second inorganic encapsulation layers 142 and 146 is deposited.

The organic encapsulation layer 144 reduces stress between layers due to bending of an organic light-emitting display device and improves planarization. The organic encapsulation layer 144 is formed on the substrate 101 on which the first inorganic encapsulation layer 142 is formed, and is made of a non-photosensitive organic dielectric material, such as a particle cover layer (PCL), an acrylic resin, an epoxy resin, polyimide, polyethylene, or silicon oxycarbide (SiOC), or a photosensitive organic dielectric material, such as photo acrylic. The organic encapsulation layer 144 is disposed in an active area AA, excluding a non-active area NA. To this end, at least one dam 110 is disposed to prevent the organic encapsulation layer 144 from spreading to the non-active area NA. The at least one dam 110 is made of the same material as at least one of the pixel planarization layer 166, the bank 128, or a spacer (not shown). For example, in the case in which three dams 110 are provided, a first dam 1101, which is the most adjacent to the active area AA, is formed by sequentially stacking a second sub dam layer 110b made of the same material as the bank 128 and a third sub dam layer 110c made of the same material as the spacer. A third dam 1103, which is the most distant from the active area AA, is formed by sequentially stacking a first sub dam layer 110a made of the same material as the pixel planarization layer 166 and a second sub dam layer 110b made of the same material as the bank 128. A second dam 1102, which is disposed between the first and third dams 1101 and 1103, is formed by sequentially stacking a first sub dam layer 110a made of the same material as the pixel planarization layer 166, a second sub dam layer 110b made of the same material as the bank 128, and a third sub dam layer 110c made of the same material as the spacer. Meanwhile, since the organic encapsulation layer 144 is disposed on at least a portion of the first dam 1101, which is the most adjacent to the active area AA, the organic encapsulation layer 144 compensates for a step between each of the pixel planarization layer 166 and the bank 128 and the dam 110. In addition, the area in which the organic encapsulation layer 144 is formed may be defined by only the second and third dams 1102 and 1103 without the first dam 1101, which has the lowest height among the first to third dams 1101, 1102, and 1103.

A plurality of touch electrodes 150 is disposed on the encapsulation unit 140. Each of the plurality of touch electrodes 150 includes capacitance formed therein and thus is used as a self-capacitance touch sensor configured to sense a change in capacitance due to user touch. In a self-capacitance sensing method using such a touch electrode 150, electric charge is accumulated in a touch sensor when a drive signal supplied through a touch pad 170 is applied to the touch electrode 150 through a touch line 152. At this time, when a user's finger or a conductive object contacts the touch electrode 150, parasitic capacitance is additionally connected to a self-capacitance sensor, whereby the value of capacitance is changed. Consequently, the value of capacitance of the touch sensor touched by the finger is different from the value of capacitance of a touch sensor not touched by the finger, whereby it is possible to determine whether touch has been performed.

To this end, the plurality of touch electrodes 150 is independently formed on the encapsulation unit 140 in the state of being split in first and second directions that intersect each other. Each of the plurality of touch electrodes 150 is formed so as to have a size corresponding to a plurality of subpixels in consideration of user touch area. For example, one touch electrode 150 has a size several times to several hundred times larger than one subpixel.

The touch electrode 150 is formed so as to have a single-layered structure or a multi-layered structure using an opaque metal that exhibits high corrosion resistance, acid resistance, and conductivity, such as Ta, Ti, Cu, or Mo. For example, the touch electrode 150 is formed of Ti/Al/Ti. As shown in FIG. 3, each of the touch electrode 150 and a redundant electrode 160 using the opaque metal is formed in a mesh shape in which each of the touch electrode and the redundant electrode does not overlap an emission area EA of each subpixel SP and overlaps a non-emission area NEA in which the bank 128 is disposed, whereby it is possible to prevent reduction in an aperture ratio and transmittance due to the touch electrode 150. The mesh-shaped touch electrode 150 exhibits higher conductivity than a transparent conductive film, whereby the touch electrode 150 may be formed as a low-resistance electrode. Consequently, the resistance and capacitance of the touch electrode 150 are reduced, whereby RC delay is reduced and thus touch sensitivity is improved.

Each of the plurality of touch electrodes 150 is connected to a corresponding one of the plurality of touch lines 152 one to one. That is, each of the plurality of touch electrodes 150 is electrically connected to one of the plurality of touch lines 152 intersecting the touch electrodes 150, and is electrically isolated from the other touch lines 152. For example, an m-th touch electrode 150 (m being a natural number) is electrically connected to an m-th touch line 152 through at least one touch contact hole, and is electrically isolated from the other touch lines 152 excluding the m-th touch line 152. An (m+1)-th touch electrode 150 is electrically connected to an (m+1)-th touch line 152 through at least one touch contact hole, and is electrically isolated from the other touch lines 152 excluding the (m+1)-th touch line 152.

The touch lines 152 intersecting the plurality of touch electrodes 150 are disposed so as to overlap the bank 128, whereby it is possible to prevent deterioration in an aperture ratio due to the touch lines 152. In addition, the touch lines 152 are disposed on the upper surface and the side surface of the second inorganic encapsulation layer 146, which is the uppermost layer of the encapsulation unit 140. Even when external oxygen or moisture is introduced through the touch lines 152, therefore, the oxygen or moisture is blocked by the encapsulation unit 140, whereby it is possible to protect the light-emitting stack 124 from the oxygen or moisture. For example, the touch lines 152 may be disposed on a touch buffer film 148 disposed on the second inorganic encapsulation layer 146 so as to contact the touch buffer film 148, or may be disposed on the second inorganic encapsulation layer 146 so as to contact the second inorganic encapsulation layer 146 without a separate touch buffer film.

Figure 4:
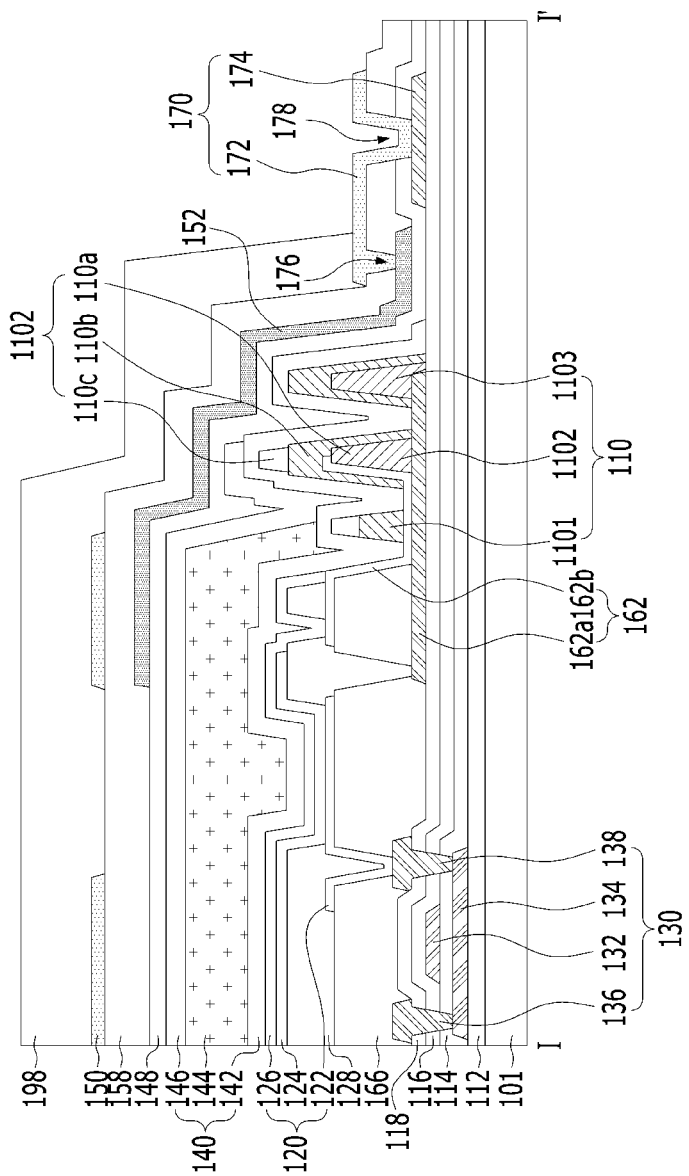
FIG. 4 is a cross-sectional view showing another aspect of a touch pad shown in FIG. 2.

Each of the touch lines 152 is electrically connected to the touch pad 170. As shown in FIG. 2 or 4, the touch pad 170 includes at least one touch pad electrode 172 and 174.

At least one of the first and second touch pad electrode 174 and 172 included in the touch pad 170 shown in FIG. 2 is made of the same metal as a conductive film disposed on the encapsulation unit. For example, since the first touch pad electrode 174 is formed on the touch buffer film so as to extend from the touch line 152, the first touch pad electrode 174 is made of the same material as the touch line 152. The second touch pad electrode 172 is made of the same material as the touch electrode 150, and is disposed on a touch dielectric film 158. The second touch pad electrode 172 is electrically connected to the first touch pad electrode 174 exposed through a pad contact hole 178 formed through the touch dielectric film 158.

At least one of the first touch pad electrode 174 or the second touch pad electrode 172 included in the touch pad 170 shown in FIG. 4 is made of the same metal as a conductive film disposed under the encapsulation unit. For example, the first touch pad electrode 174 shown in FIG. 4 is made of the same material and is disposed in the same plane as the source and drain electrodes 136 and 138. The second touch pad electrode 172 is made of the same material as the touch electrode 150, and is disposed on the touch dielectric film 158. The second touch pad electrode 172 is electrically connected to the first touch pad electrode 174 exposed through a pad contact hole 178 formed through the touch buffer film 148 and the touch dielectric film 158. In addition, the second touch pad electrode 172 is electrically connected to the touch line 152 exposed through a dummy contact hole 176 formed through the touch dielectric film 158 (this case is shown in FIG. 4), or the first touch pad electrode 174 is exposed through a dummy contact hole 176 formed through the touch buffer film 148 and the touch dielectric film 158 and is electrically connected to the touch line 152 (this case is not shown).

The touch pad 170 and the display pad 180 are formed so as to be exposed by a touch passivation film 198 and thus are connected to a signal transmission film on which a touch drive circuit (not shown) is mounted. Here, the touch passivation film 198 is formed so as to cover the touch electrode 150 in order to prevent the touch electrode 150 from being corroded by external moisture. The touch passivation film 198 is made of an organic insulative material, such as epoxy or acrylic, and is formed in the shape of a thin film or a film, or is made of an inorganic insulative material, such as SiNx or SiOx.

In the present disclosure, the area of the touch electrode 150 overlapping the touch line 152 is reduced in order to reduce parasitic capacitance between the touch electrode 150 and the touch line 152.

Figure 5:
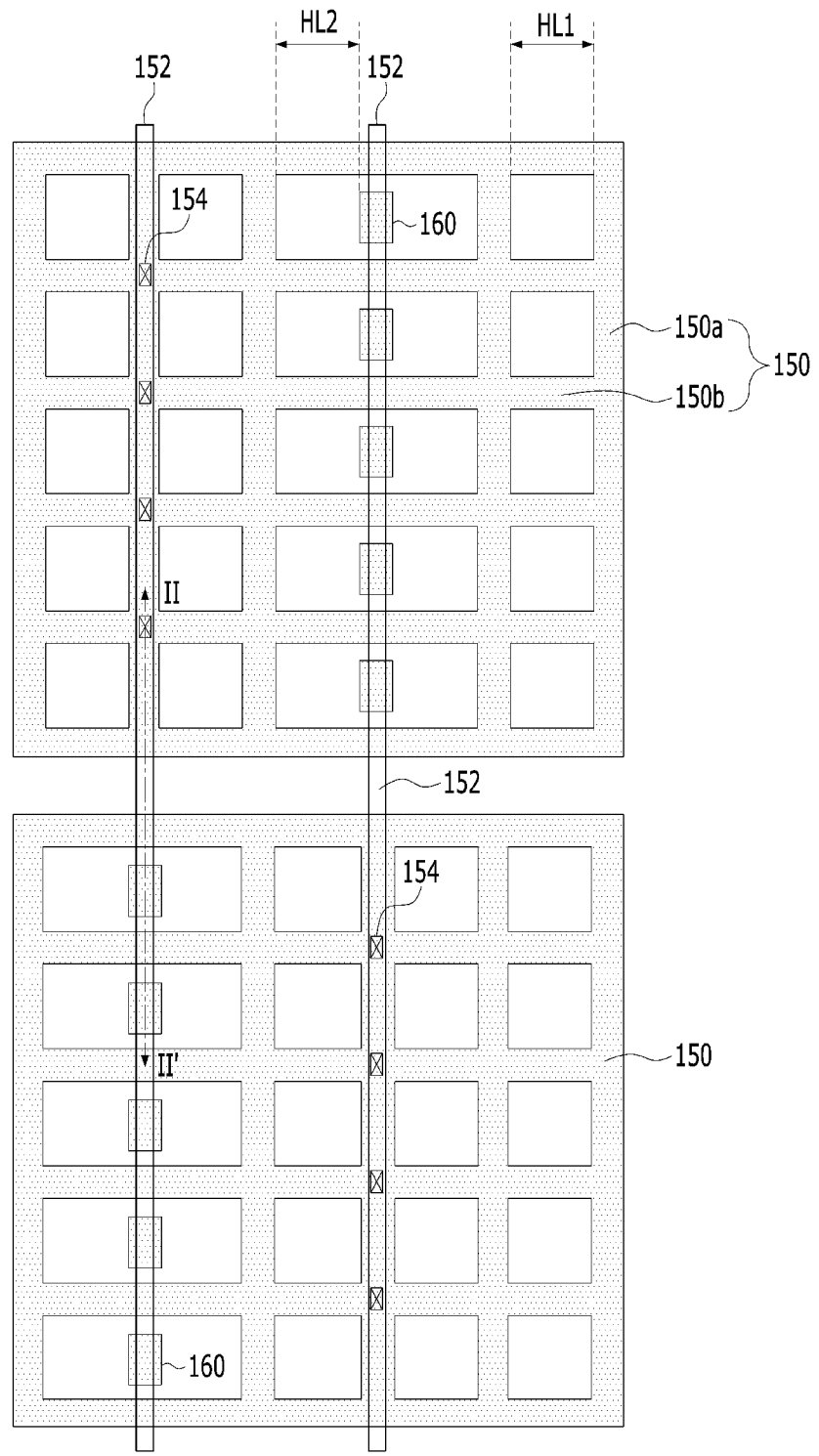
FIG. 5 is a plan view showing a first aspect of a touch sensor according to the present disclosure.
Figure 6:
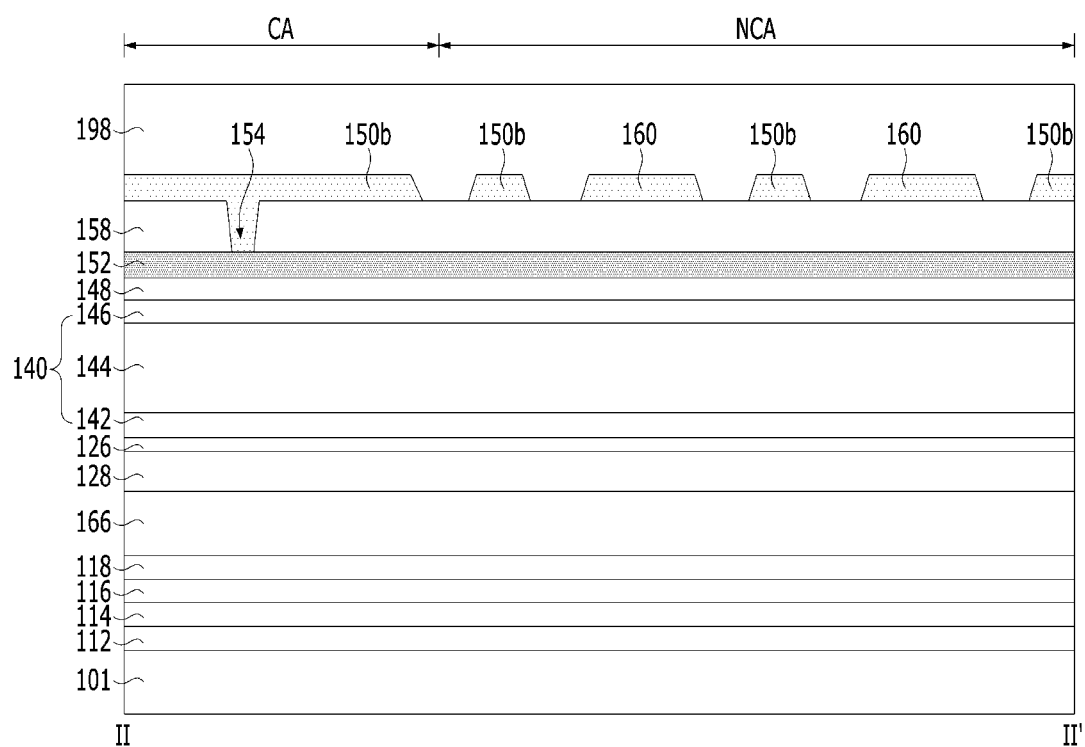
FIG. 6 is a cross-sectional view of the touch display device taken along line II-IT of FIG. 5.

FIGS. 5 and 6 are a plan view and a cross-sectional view showing a first aspect of a touch sensor according to the present disclosure.

Each of the plurality of touch electrodes 150 shown in FIGS. 5 and 6 includes first and second electrode portions 150a and 150b that intersect each other and thus is formed in a mesh shape. The first electrode portion 150a extends in a first direction, and the second electrode portion 150b extends in a second direction, which intersects the first direction. For example, the first electrode portion 150a extends in the vertical direction, and the second electrode portion 150b extends in the horizontal direction.

Redundant electrodes 160 are independently of each other disposed in each of the plurality of touch electrodes 150. The redundant electrode 160 is spaced apart from the touch electrode in a floating state. In addition, the redundant electrode 160 is disposed in the unit pixel on the encapsulation unit 140.

Since the redundant electrode 160 is made of the same material as the touch electrode 150 and is disposed in the same plane as the touch electrode 150, the redundant electrode 160 is disposed so as to overlap the touch line 152 in the state in which the touch dielectric film 158 is disposed therebetween. The redundant electrode 160 is formed so as to have a smaller line width than the bank 128, like the touch electrode 150, and overlaps the bank 128 disposed in the non-emission area. In addition, the horizontal distance HL1 between the first electrode portions 150a and the horizontal distance HL2 between the redundant electrode 160 and the first electrode portion 150a are equal or similar to each other. Consequently, the redundant electrode 160 is disposed in a line with the first electrode portion 150a of the touch electrode extending in the first direction, whereby it is possible to prevent the redundant electrode 160 from being seen.

The touch lines 152 are connected to the touch electrodes 150 one to one. For example, a first touch line T1 is connected to a first touch electrode E1, and is not connected to the other touch electrodes E2, . . . , and Em disposed in the first touch electrode E1 in a line. A second touch line T2 is connected to a second touch electrode E2, and is not connected to the other touch electrodes E1, E3, . . . , and Em disposed in the second touch electrode E2 in a line.

In the touch lines 152, the number and disposition of touch lines T1, T2, . . . , and Tm extending through a plurality of touch electrodes disposed in a line are determined depending on the number of subpixel rows disposed per touch electrode 150. For example, in the case in which the number of subpixel rows disposed per touch electrode 150 is equal to the number of touch lines T1, T2, . . . , and Tm or is less by one than the touch lines T1, T2, . . . , and Tm, the touch lines T1, T2, . . . , and Tm are formed so as to have a structure shown in FIG. 7A. In the case in which the number of subpixel rows disposed per touch electrode 150 is greater than the number of touch lines T1, T2, . . . , and Tm, the touch lines T1, T2, . . . , and Tm are formed so as to have one of structures shown in FIGS. 7B to 7D.

Figure 7A:
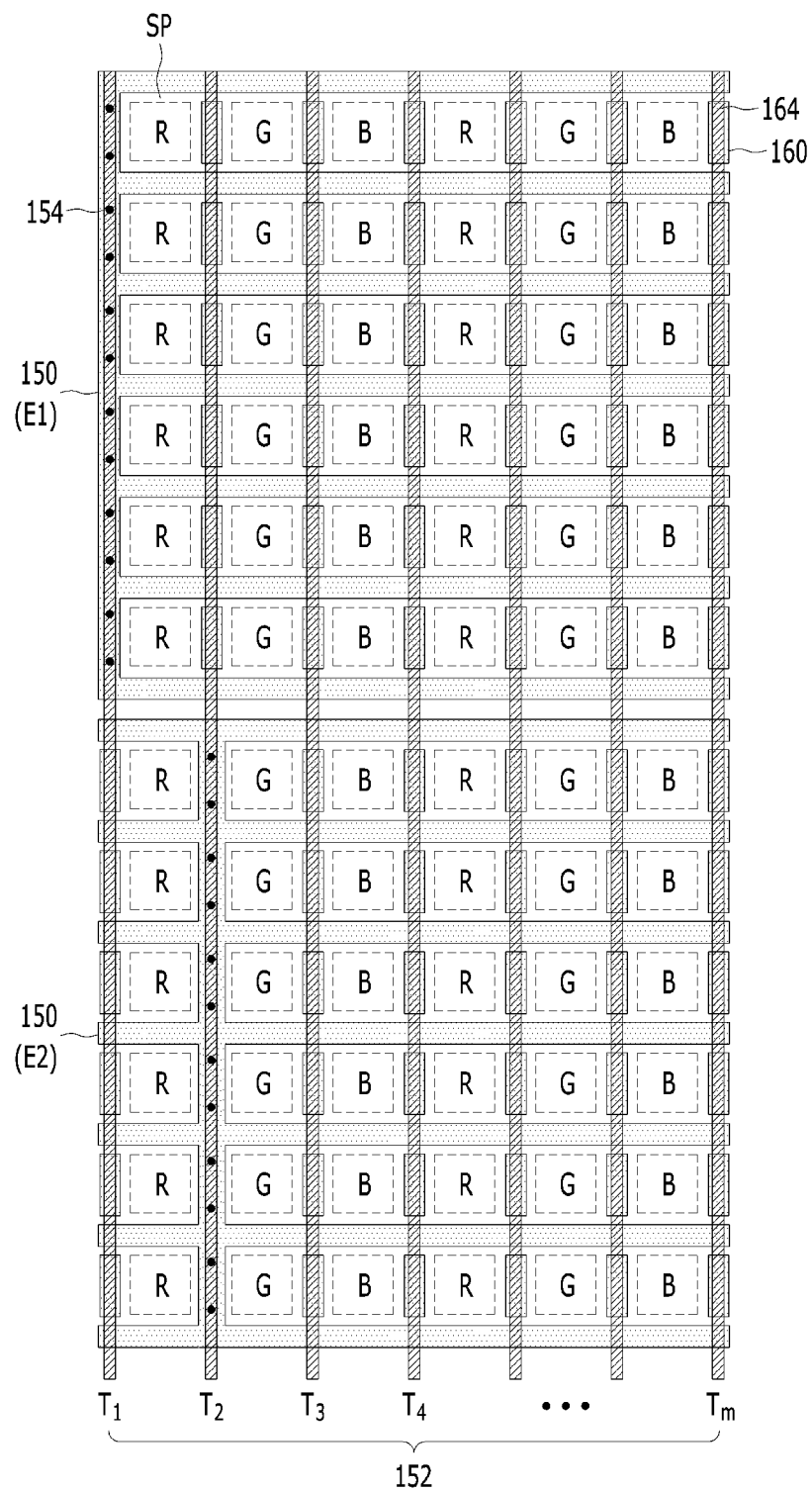
FIGS. 7A to 7D are plan views showing dispositional relationships between a touch electrode, a subpixel, and a touch line shown in FIG. 5.

The touch lines T1, T2, . . . , and Tm shown in FIG. 7A are disposed per one subpixel row in which a plurality of subpixels SP is disposed in a line in the vertical direction. In this case, the redundant electrode 160 is disposed per subpixel SP arranged in the horizontal direction one by one, and therefore the subpixels SP and the redundant electrodes 160 arranged in the horizontal direction are alternately disposed. That is, each of the plurality of touch lines T1, T2, . . . , and Tm and a corresponding one of the redundant electrodes 160 are respectively disposed so as to be spaced apart from each other in the state in which a subpixel SP including a light-emitting element is interposed therebetween.

Figure 7B:
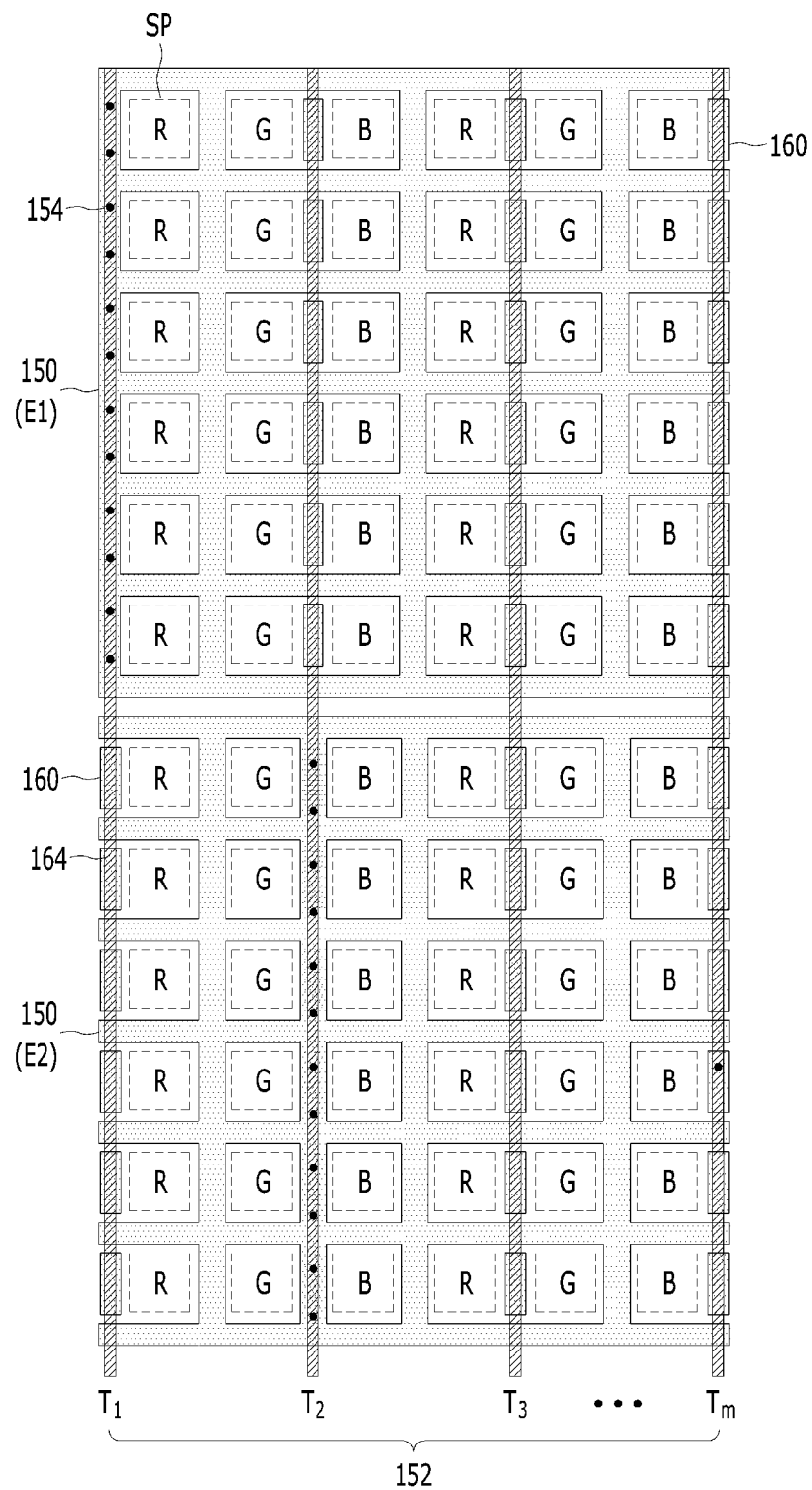
Figure 7C:
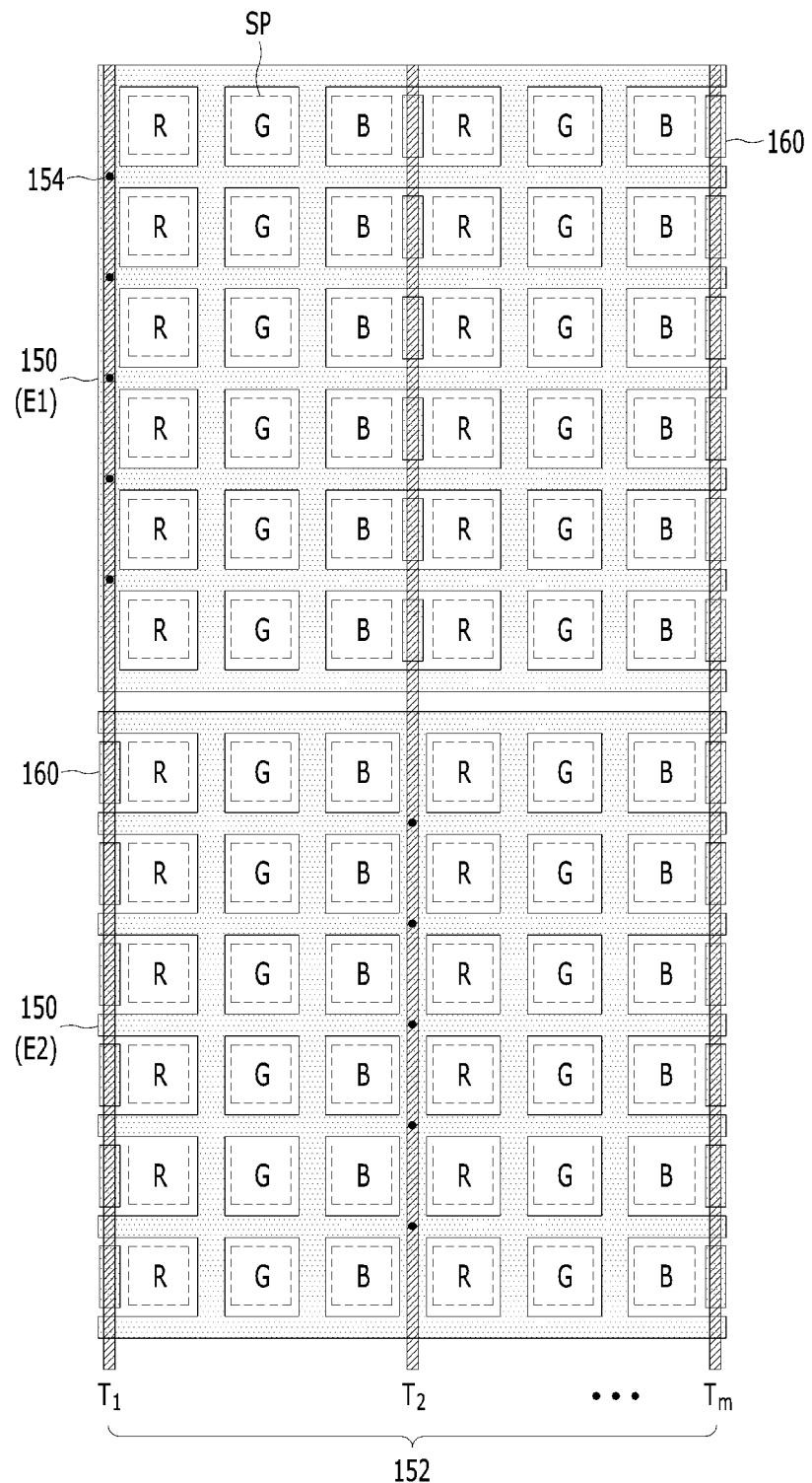
Figure 7D:
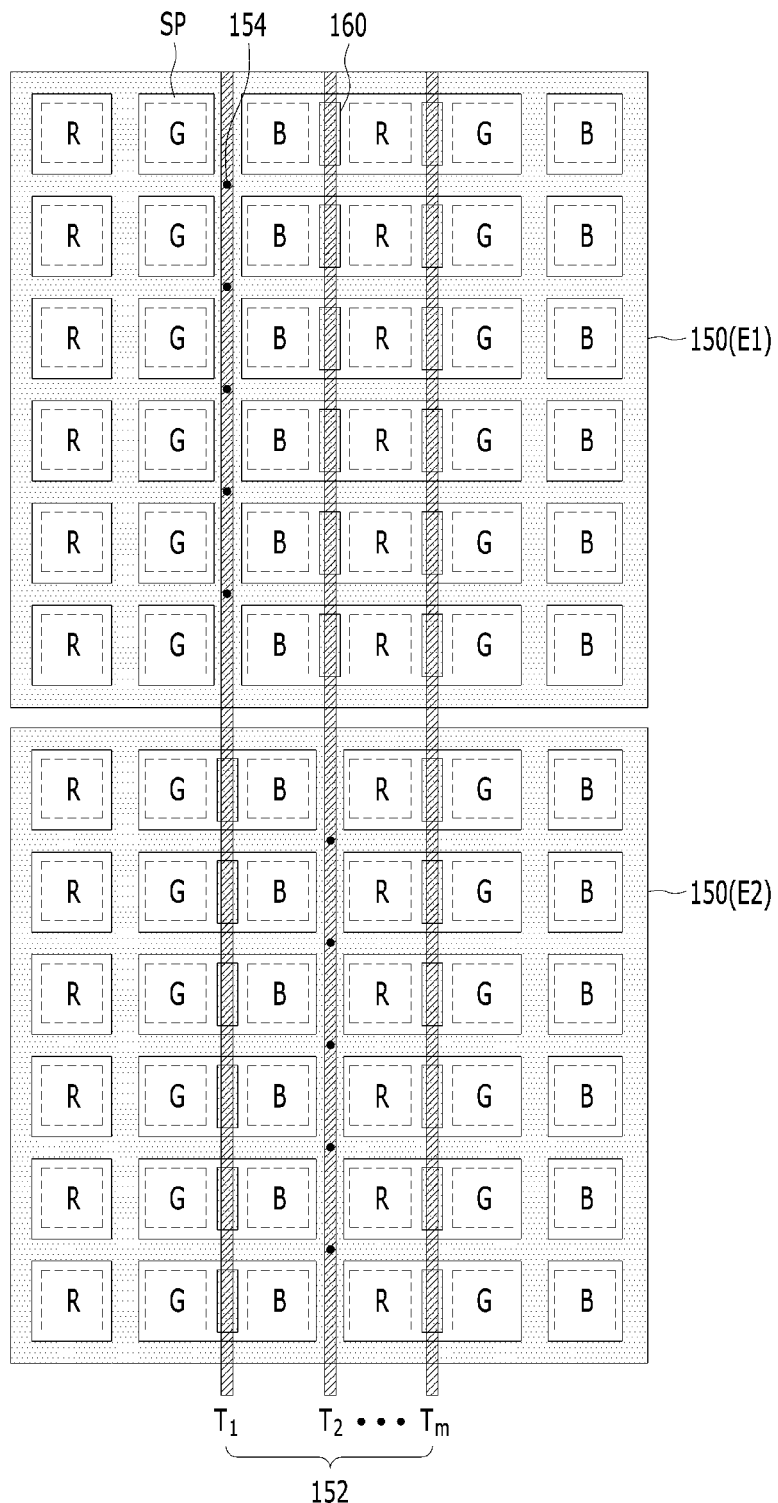

The touch lines T1, T2, . . . , and Tm shown in FIG. 7B are disposed per two subpixel rows, and the redundant electrodes 160 are disposed per two subpixels arranged in the horizontal direction one by one. That is, the plurality of touch lines T1, T2, . . . , and Tm and the redundant electrodes 160 are respectively disposed so as to be spaced apart from each other in the state in which two subpixels arranged in the horizontal direction are interposed therebetween. The touch lines T1, T2, . . . , and Tm shown in FIG. 7C are disposed per three subpixel rows, and the redundant electrodes 160 are disposed per three subpixels arranged in the horizontal direction one by one. That is, the plurality of touch lines T1, T2, . . . , and Tm and the redundant electrodes 160 are respectively disposed so as to be spaced apart from each other in the state in which three subpixels arranged in the horizontal direction are interposed therebetween. The touch lines T1, T2, . . . , and Tm shown in FIG. 7D are disposed so as to extend through the middle area of each touch electrode 150 excluding the left area and the right area. In this case, the redundant electrode 160 is disposed between subpixels SP disposed in the middle area of each touch electrode 150.

The touch line 152 is exposed through a touch contact hole 154 formed through the touch dielectric film 158 in a contact area CA in which the touch line 152 is contacted with the touch electrode 150, and is connected to the touch electrode 150. In addition, the touch line 152 is disposed so as to intersect the touch electrode 150 and the redundant electrode 160 in a non-contact area NCA in which the touch line 152 is not contacted with the touch electrode 150. In this case, the touch line 152 overlaps the redundant electrode 160 in a floating state in the non-contact area NCA. That is, since the touch line 152 overlaps the second electrode portion 150b of the touch electrode 150, excluding the first electrode portion 150a, in the non-contact area NCA, it is possible to reduce the overlapping area between the touch line 152 and the touch electrode 150 in the non-contact area NCA. Consequently, it is possible to reduce parasitic capacitance between the touch line 152 and the touch electrode 150 in the non-contact area NCA between the touch line 152 and the touch electrode 150, whereby RC delay is reduced and thus touch performance is improved.

Figure 8:
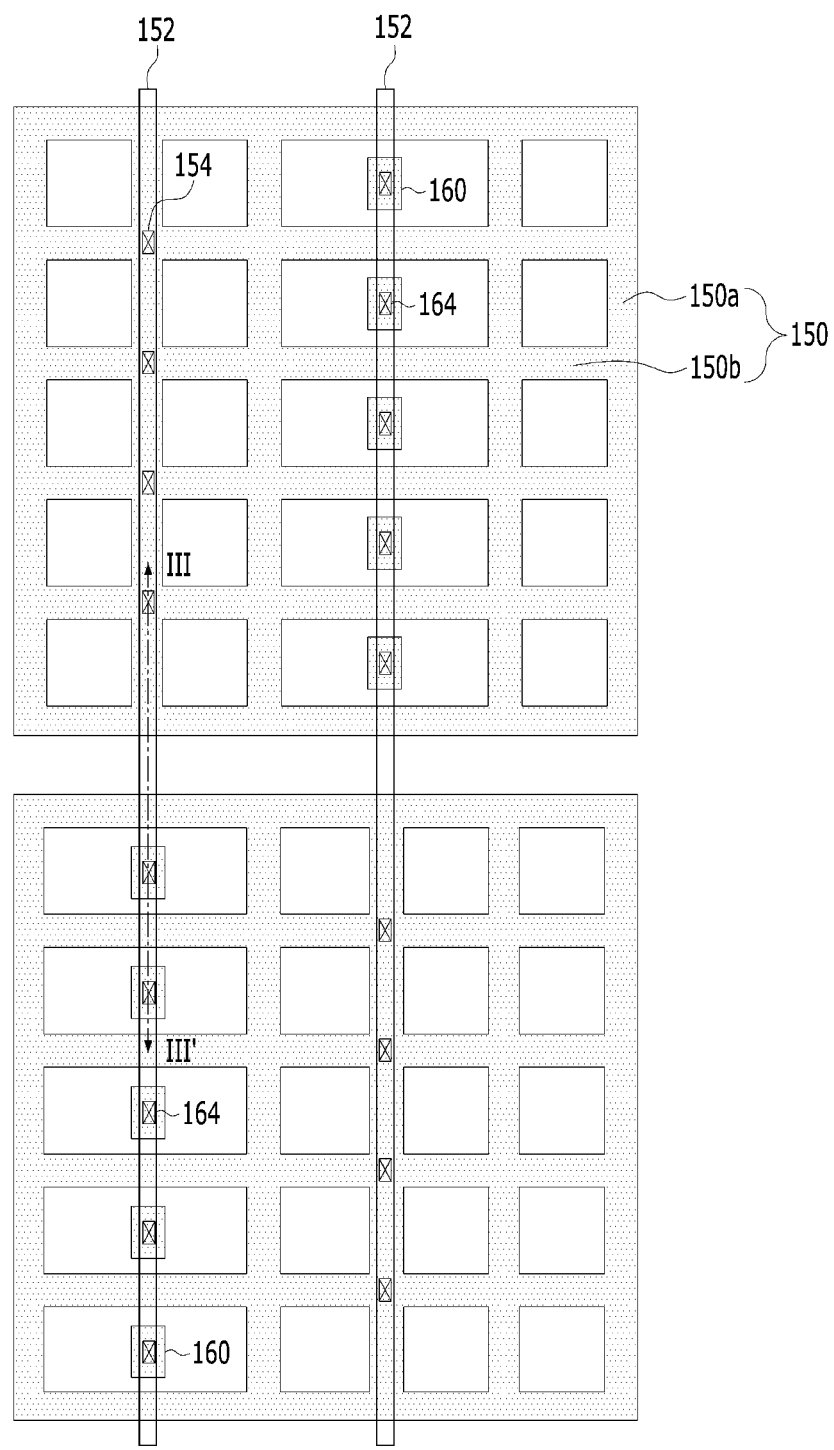
FIG. 8 is a plan view showing a second aspect of the touch sensor according to the present disclosure.
Figure 9:
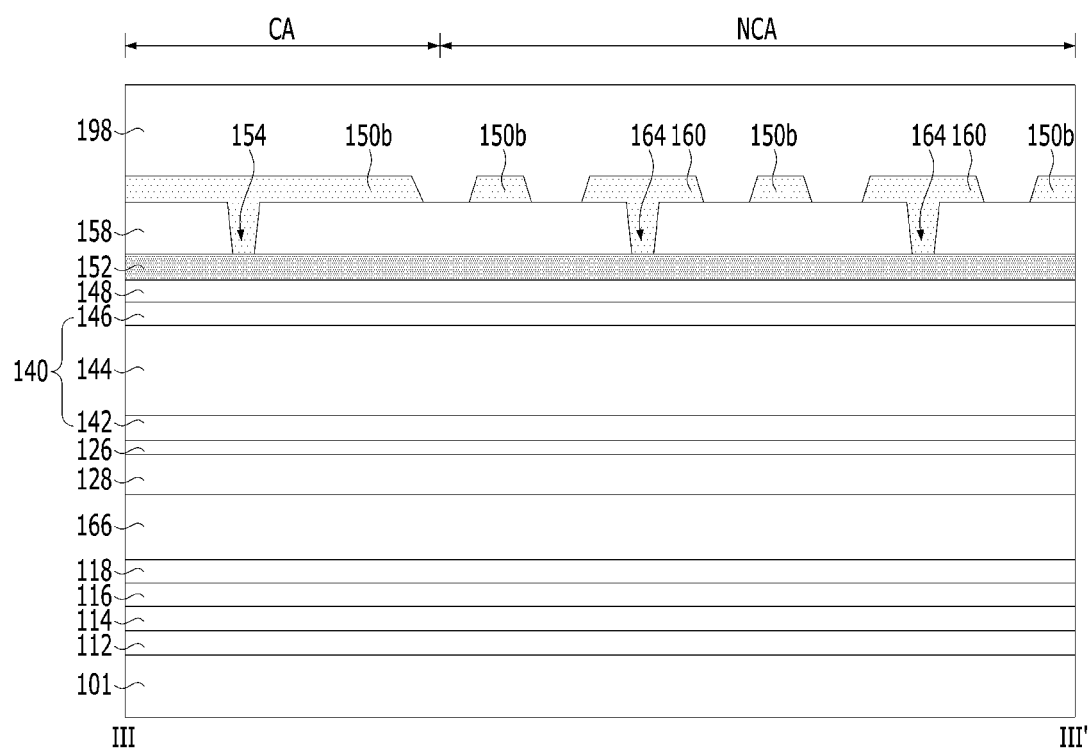
FIG. 9 is a cross-sectional view of the touch display device taken along line of FIG. 8.

FIGS. 8 and 9 are a plan view and a cross-sectional view showing a second aspect of the touch sensor according to the present disclosure.

The touch sensor shown in FIGS. 8 and 9 includes the same components as the touch sensor shown in FIGS. 5 and 6 except that redundant electrodes 160 are electrically connected to touch lines 152. Consequently, a detailed description of the same components will be omitted.

Each redundant electrode 160 is electrically connected to a touch line 152 exposed through a redundant contact hole 164 formed through a touch dielectric film 158, whereby no parasitic capacitance is formed between the touch line 152 and the redundant electrode 160. Consequently, it is possible to reduce parasitic capacitance between the touch line 152 and the touch electrode 150 in a non-contact area NCA between the touch line 152 and the touch electrode 150, whereby touch performance is improved.

In addition, a plurality of redundant electrodes 160 is electrically connected to a touch line 152, whereby the plurality of redundant electrodes 160 is connected to the touch line 152 in parallel. Consequently, it is possible to reduce distortion of a touch signal transmitted through the touch line 152. This will be described with reference to a comparative example shown in FIG. 10A and an equivalent circuit diagram of an aspect of FIG. 10B.

Figure 10A:
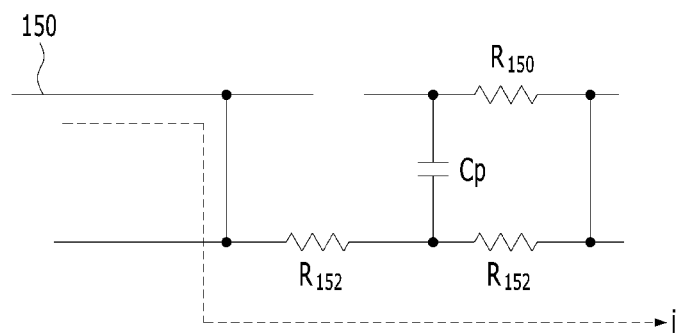
FIGS. 10A and 10B are equivalent circuit diagrams showing dispositional relationships between a touch electrode and a touch line according to a comparative example and the present disclosure.

In the comparative example shown in FIG. 10A, the touch line 152 and the touch electrode 150 overlap each other in the state in which a touch dielectric film 158 is disposed therebetween in the non-contact area NCA between the touch line 152 and the touch electrode 150. Consequently, parasitic capacitance Cp between the touch line 152 and the touch electrode 150 is increased, whereby touch performance is deteriorated.

Figure 10B:
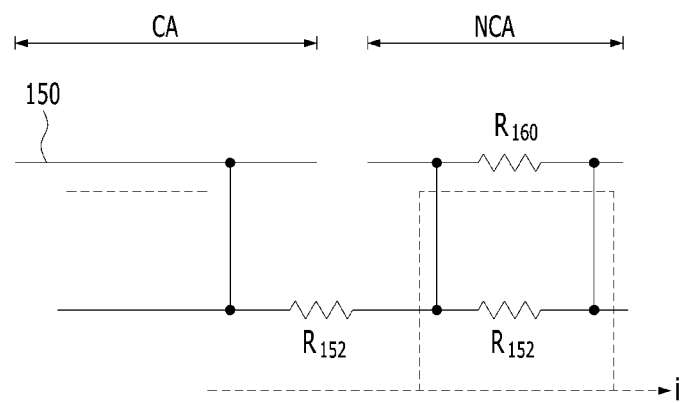

In contrast, in the aspect shown in FIG. 10B, the redundant electrode 160 is electrically connected to the touch line 152, whereby the redundant electrode 160 and the touch line 152 have the same potential. Consequently, self-resistance R152 of the touch line 152 is connected to self-resistance R160 of the redundant electrode 160 in parallel, whereby the total self-resistance of the touch line 152 is reduced. In addition, no parasitic capacitance is formed between the touch line 152 and the redundant electrode 160 having the same potential as the touch line 152. In this case in which the total self-resistance of the touch line 152 and the parasitic capacitance are reduced, as described above, the magnitude of RC delay is reduced, whereby it is possible to reduce distortion of a touch signal transmitted through the touch line 152.

Furthermore, the plurality of redundant electrodes 160 is electrically connected to the touch line 152 to form multiple paths. Consequently, the redundant electrodes 160 may be used as redundancy in case of breakage of the touch line 152, whereby it is possible to improve yield.

Figure 11A:
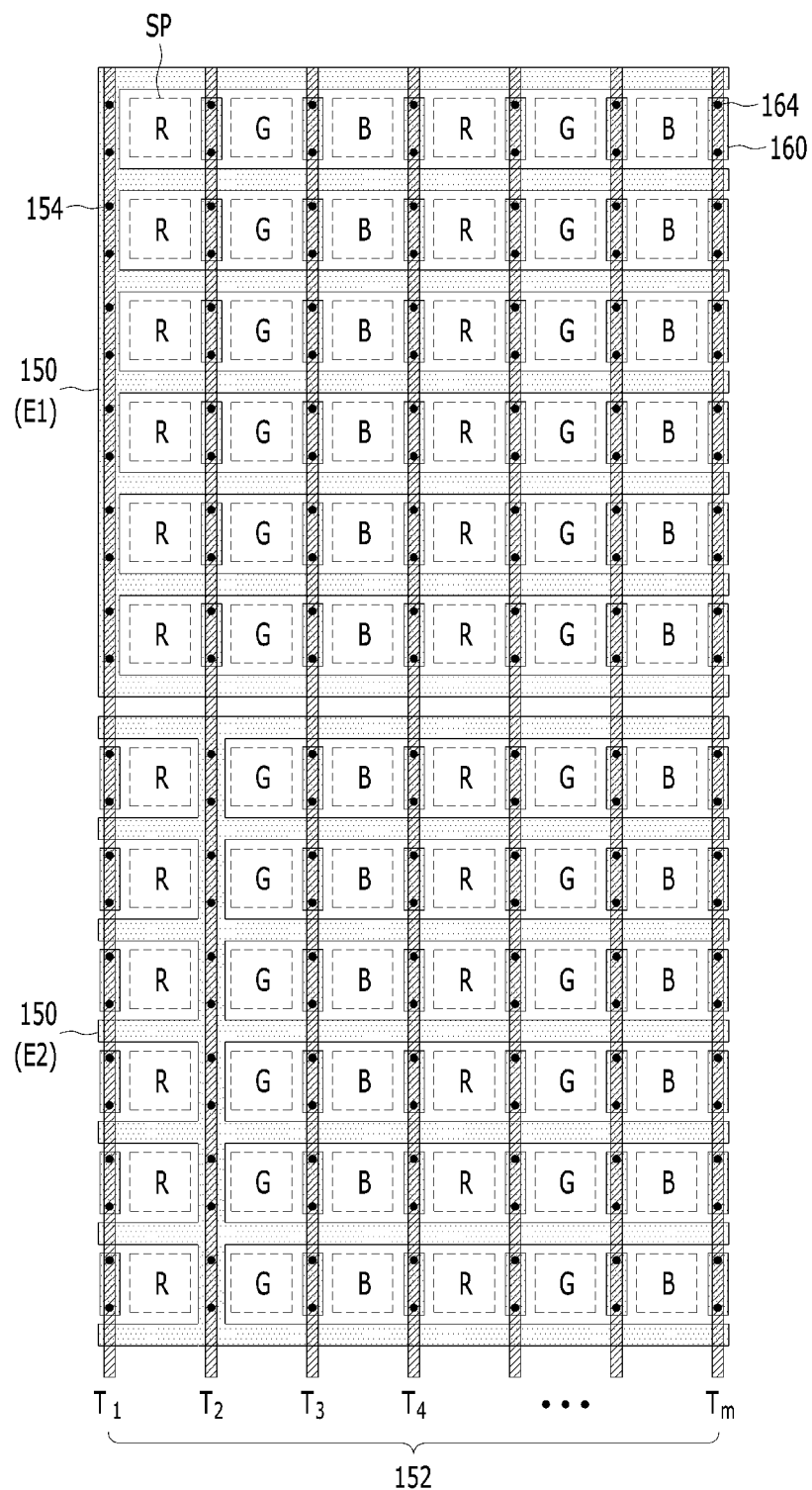
FIGS. 11A to 11D are plan views showing dispositional relationships between a touch electrode, a subpixel, and a touch line shown in FIG. 8.
Figure 11B:
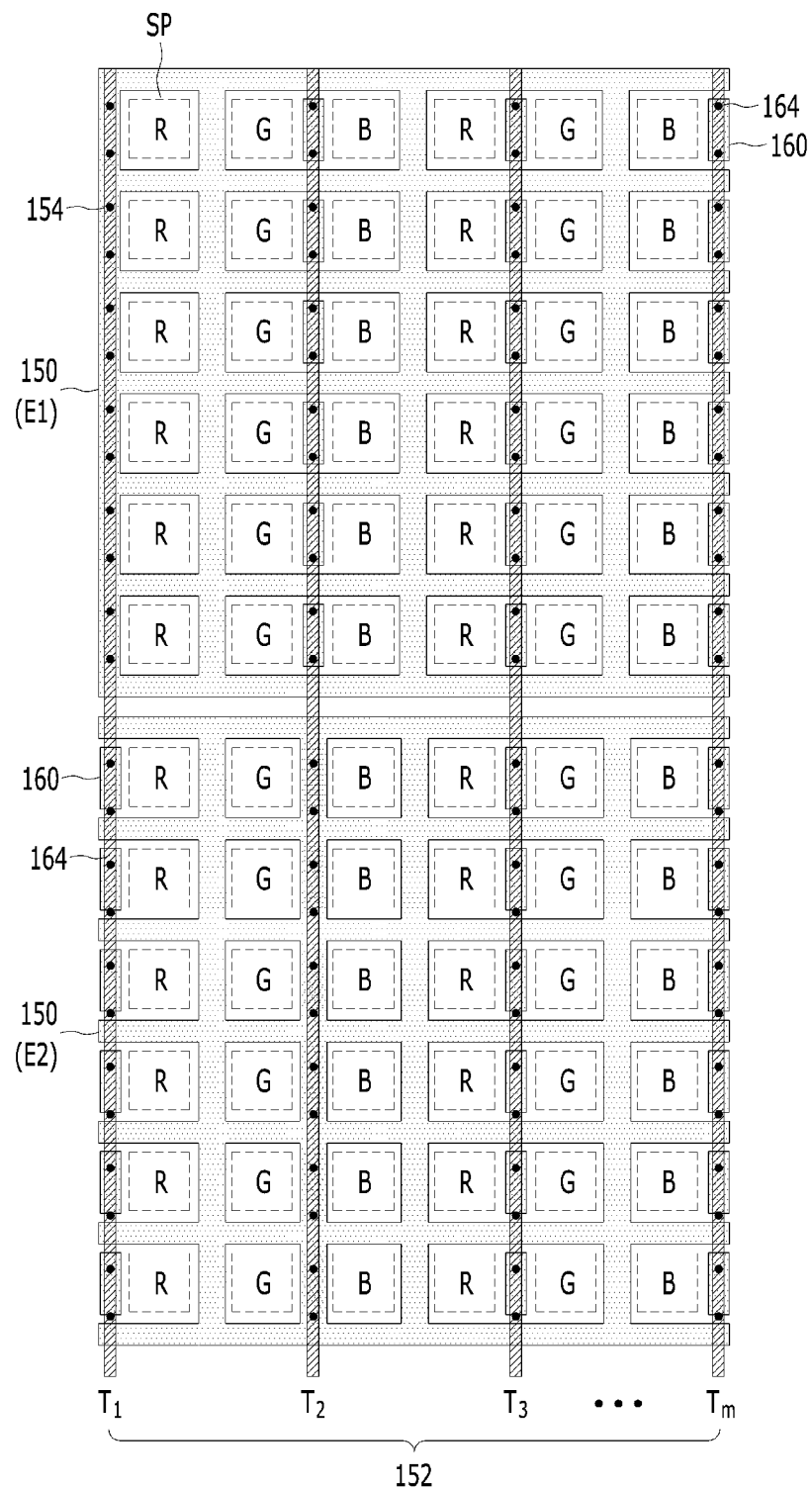
Figure 11C:
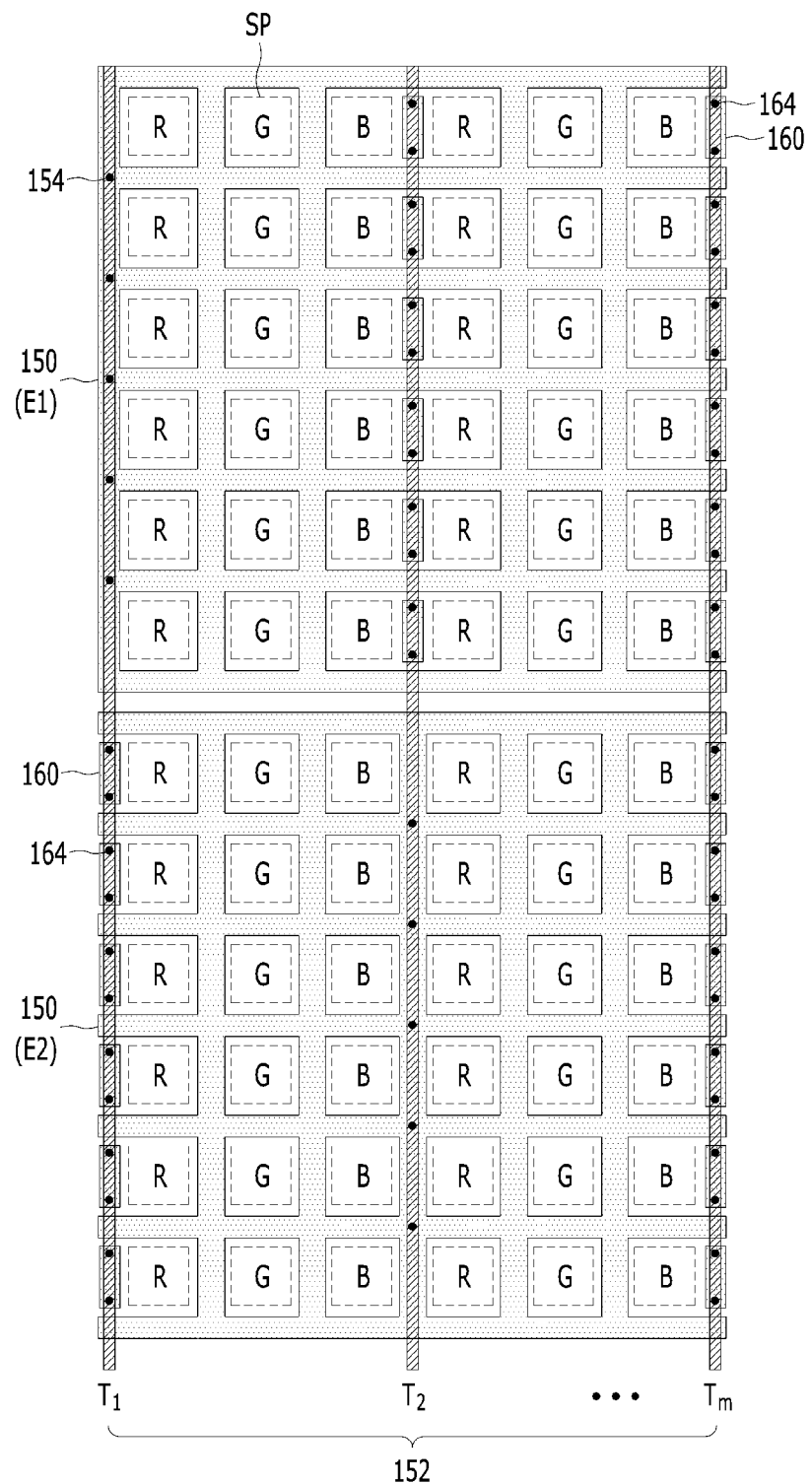
Figure 11D:
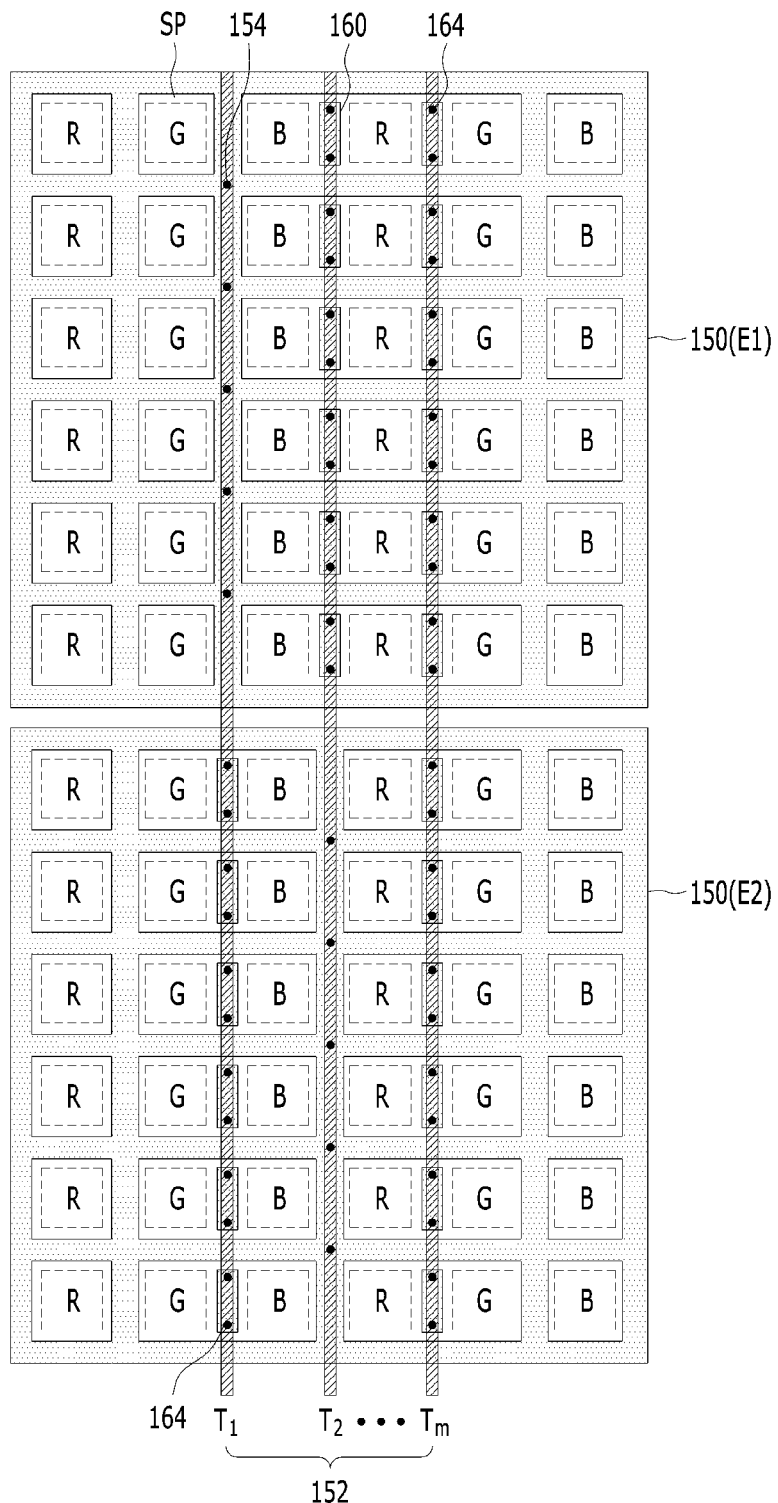

The touch lines 152 connected to the plurality of redundant electrodes 160 are formed so as to have one of structures shown in FIGS. 11A to 11D. Touch lines T1, T2, . . . , and Tm shown in FIGS. 11A to 11C are disposed per i subpixel rows (i being a natural number) in which a plurality of subpixels is disposed in a line in the vertical direction. In this case, the redundant electrode 160 is disposed per i subpixels SP arranged in the horizontal direction one by one. The touch lines T1, T2, . . . , and Tm shown in FIG. 11D are disposed so as to extend through the middle area of each touch electrode 150 excluding the left area and the right area. In this case, the redundant electrodes 160 are disposed between subpixels SP disposed in the middle area of each touch electrode 150.

Figure 12:
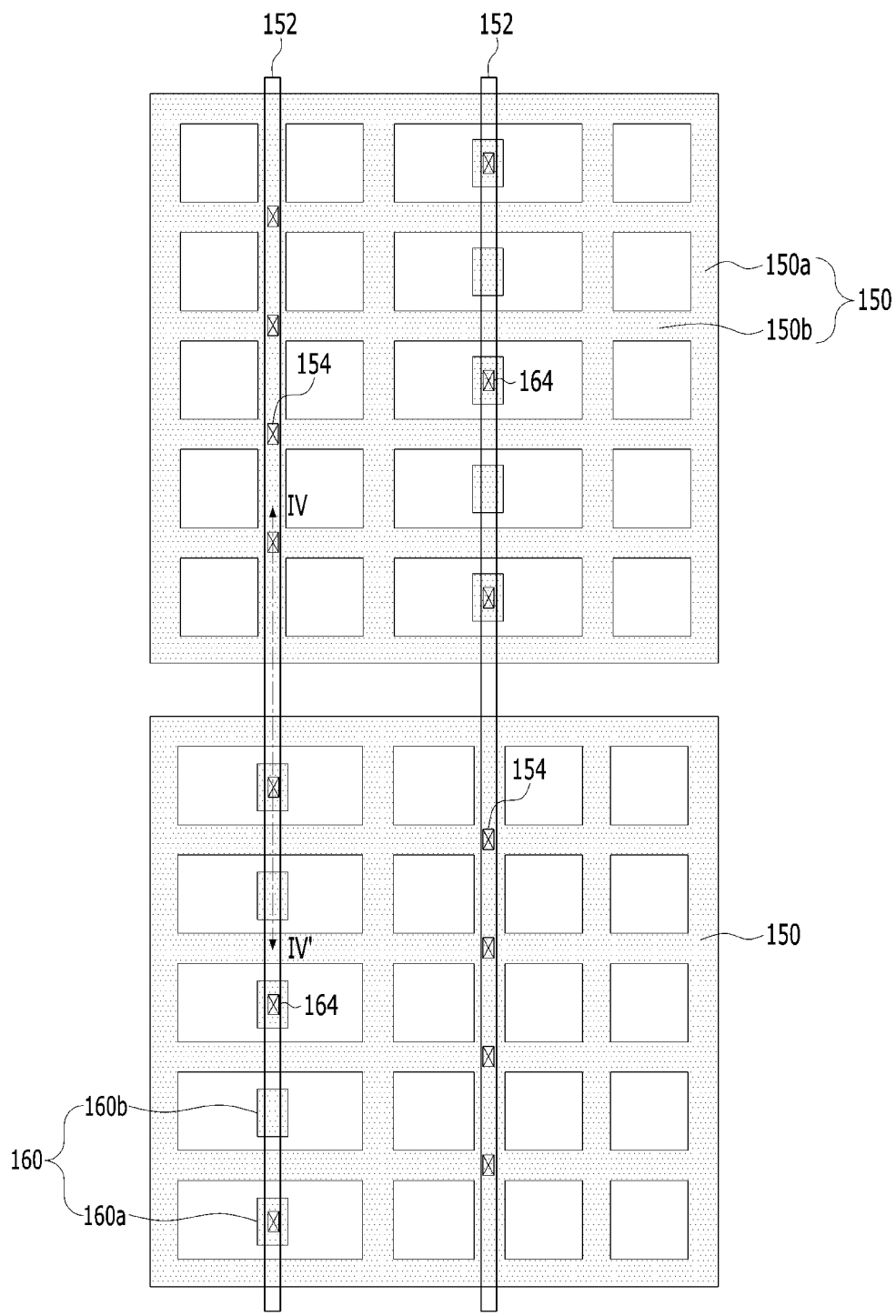
FIG. 12 is a plan view showing a third aspect of the touch sensor according to the present disclosure.
Figure 13:
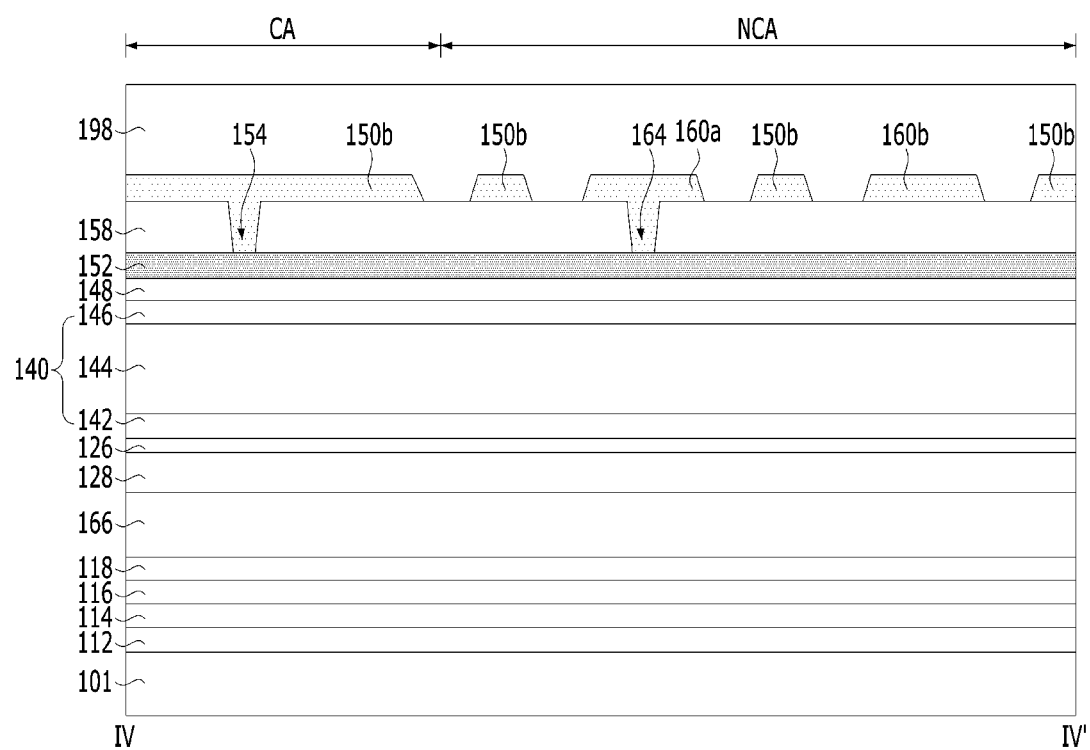
FIG. 13 is a cross-sectional view of the touch display device taken along line IV-IV' of FIG. 12.

FIGS. 12 and 13 are a plan view and a cross-sectional view showing a third aspect of the touch sensor according to the present disclosure.

The touch sensor shown in FIGS. 12 and 13 includes the same components as the touch sensor shown in FIGS. 5 and 6 except that a redundant electrode 160 includes first and second redundant electrodes 160a and 160b disposed in the same plane. Consequently, a detailed description of the same components will be omitted.

The first redundant electrode 160a is electrically connected to a touch line 152, and has the same potential as the touch line 152, whereby no parasitic capacitance is formed between the touch line 152 and the redundant electrode 160. Consequently, it is possible to reduce parasitic capacitance between the touch line 152 and the touch electrode 150 in a non-contact area NCA between the touch line 152 and the touch electrode 150, whereby touch performance is improved.

Since the second redundant electrode 160b is alternately disposed with the first redundant electrode 160a, a second electrode portion 150b of the touch electrode 150 is disposed between the first and second redundant electrodes 160a and 160b. The second redundant electrode 160b is disposed in a line with a first electrode portion 150a of the touch electrode together with the first redundant electrode 160a. The second redundant electrode 160b is formed in a floating state in which the second redundant electrode 160b is separated from the touch electrode 150 and the first redundant electrode 160a, whereby no signal is applied thereto.

The first and second redundant electrodes 160a and 160b are made of the same material and are disposed in the same plane as the touch electrode 150. For example, the first and second redundant electrodes 160a and 160b and the touch electrode 150 are formed together on a touch dielectric film 158 through a mask process using a metal layer.

The first and second redundant electrodes 160a and 160b are disposed in a line along the touch line 152. The number and disposition of touch lines T1, T2, . . . , and Tm extending through a plurality of touch electrodes disposed in a line are determined depending on the number of subpixel rows disposed per touch electrode 150. For example, the touch lines T1, T2, . . . , and Tm are disposed per i subpixel rows (i being a natural number) in which a plurality of subpixels is disposed in a line in the vertical direction, or are disposed so as to extend through the middle area of each touch electrode 150 excluding the left area and the right area.

The overlapping area between the touch line 152 and the touch electrode 150 in a non-contact area NCA may be reduced as much as the overlap area between the touch line 152 and the second redundant electrode 160b in a floating state and the first redundant electrode 160a having the same potential as the touch line 152. Consequently, it is possible to reduce parasitic capacitance between the touch line 152 and the touch electrode 150 in the non-contact area NCA between the touch line 152 and the touch electrode 150, whereby touch performance is improved.

Figure 14:
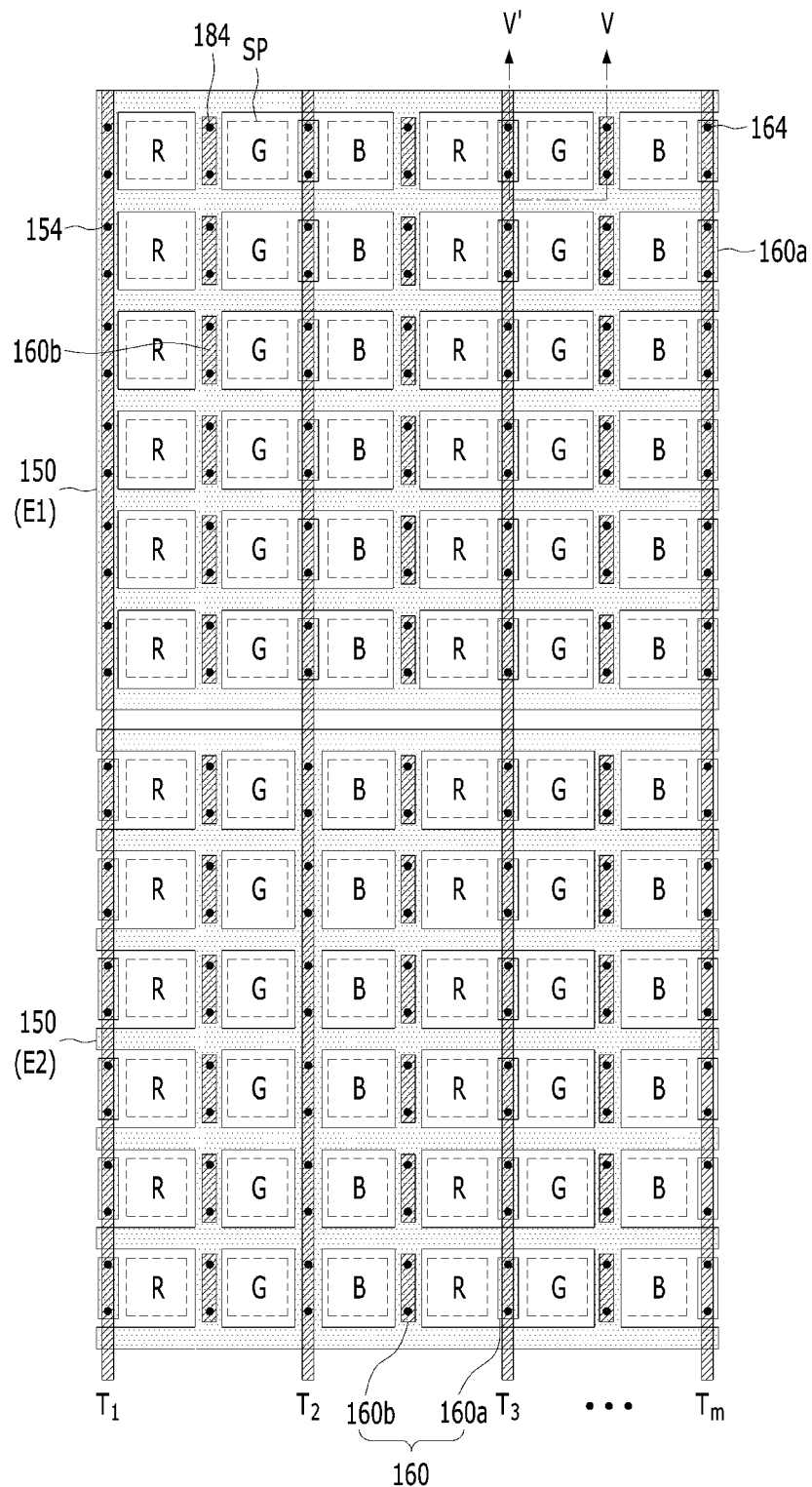
FIG. 14 is a plan view showing a fourth aspect of the touch sensor according to the present disclosure.
Figure 15:
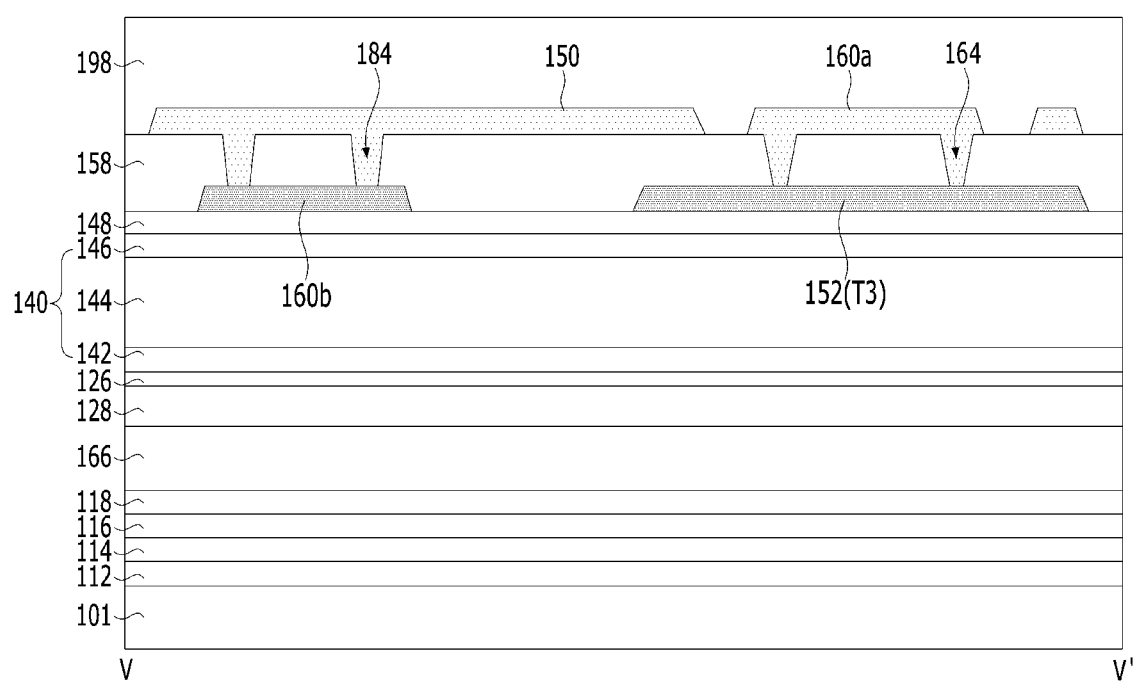
FIG. 15 is a cross-sectional view of the touch display device taken along line V-V' of FIG. 14.

FIGS. 14 and 15 are a plan view and a cross-sectional view showing a fourth aspect of the touch sensor according to the present disclosure.

The touch sensor shown in FIGS. 14 and 15 includes the same components as the touch sensor shown in FIGS. 5 and 6 except that first and second redundant electrodes 160a and 160b disposed in different planes are included. Consequently, a detailed description of the same components will be omitted.

As shown in FIGS. 14 and 16A to 16E, the first redundant electrodes 160a are disposed in a line along touch lines T1, T2, . . . , and Tm, and are disposed so as to overlap the touch lines T1, T2, . . . , and Tm. The first redundant electrodes 160a are made of the same material as touch electrodes 150, and are disposed in the same plane as the touch electrodes 150. For example, the first redundant electrodes 160a are made of the same material as the touch electrodes 150, and are disposed on a touch dielectric film 158. As shown in FIG. 15, the first redundant electrode 160a is electrically connected to a touch line 152 exposed through a first redundant contact hole 164 formed through a touch dielectric film 158. The first redundant electrode 160a electrically connected to the touch line 152 has the same potential as the touch line 152, whereby no parasitic capacitance is formed between the touch line 152 and the first redundant electrode 160a. Consequently, it is possible to reduce parasitic capacitance between the touch line 152 and the touch electrode 150 in a non-contact area NCA between the touch line 152 and the touch electrode 150, whereby touch performance is improved. In addition, a plurality of first redundant electrodes 160a is electrically connected to a touch line 152, whereby the plurality of first redundant electrodes 160a is connected to the touch line 152 in parallel. Consequently, the total internal resistance of the touch line 152 is reduced, and therefore the magnitude of RC delay is reduced, whereby it is possible to reduce distortion of a touch signal transmitted through the touch line 152.

The second redundant electrodes 160b are disposed so as to overlap touch electrodes 150 that do not overlap the touch lines T1, T2, . . . , and Tm. The second redundant electrodes 160b are made of the same material as the touch lines T1, T2, . . . , and Tm, and are disposed in the same plane as the touch lines T1, T2, . . . , and Tm. For example, the second redundant electrodes 160b are disposed on a touch buffer layer 148 and an encapsulation unit 140, and are disposed in a different plane from the first redundant electrode 160a. The second redundant electrode 160b is exposed through a second redundant contact hole 184 formed through a touch dielectric film 158, and is electrically connected to the touch electrode 150. The second redundant electrode 160b electrically connected to the touch electrode 150 has the same potential as the touch electrode 150, whereby no parasitic capacitance is formed between the touch electrode 150 and the second redundant electrode 160b. Consequently, it is possible to reduce parasitic capacitance between the touch electrode 150 and the second redundant electrode 160b in a non-contact area NCA between the touch electrode 150 and the second redundant electrode 160b, whereby touch performance is improved. In addition, a plurality of second redundant electrodes 160b is electrically connected to a touch electrode 150, whereby the plurality of second redundant electrodes 160b is connected to the touch electrode 150 in parallel. Consequently, the total internal resistance of the touch electrode 150 is reduced, and therefore the magnitude of RC delay is reduced, whereby it is possible to reduce distortion of a touch signal transmitted through the touch electrode 150.

Furthermore, at least one of the first and second redundant electrode 160a or 160b may be formed in a floating state. For example, as shown in FIGS. 16C to 16E, the second redundant electrode 160b may be formed in a floating state in which the second redundant electrode 160b is electrically separated from the touch electrode 150, whereby no signal is applied thereto.

Each of the first and second redundant electrode 160a and 160b is formed so as to have a smaller line width than the bank 128, like the touch electrode 150, and overlaps the bank 128 disposed in the non-emission area. Consequently, it is possible to prevent the first and second redundant electrode 160a and 160b from being seen by the user.

Figure 16A:
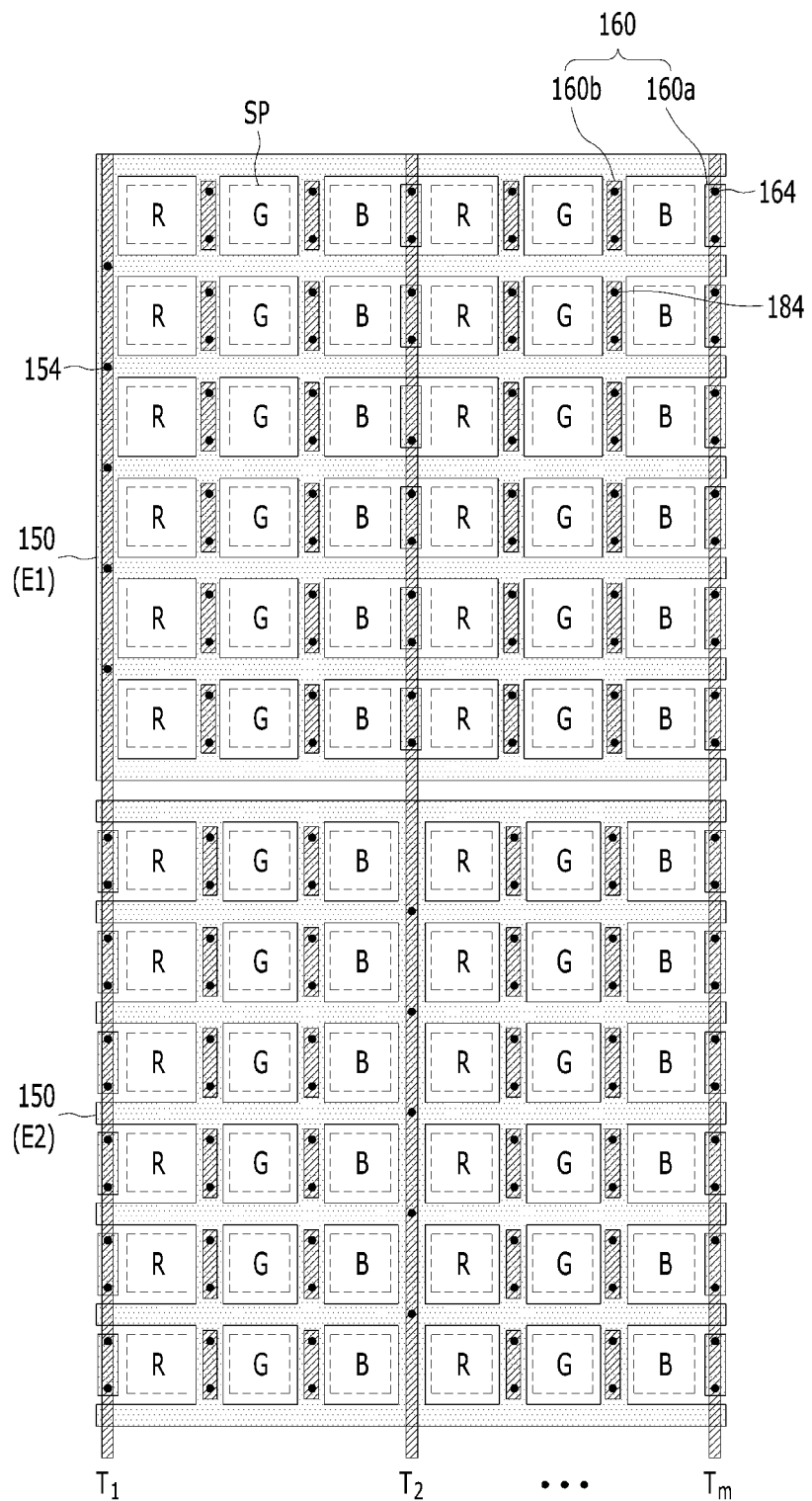
FIGS. 16A to 16E are plan views showing dispositional relationships between a touch electrode, a subpixel, and a touch line shown in FIG. 14.
Figure 16B:
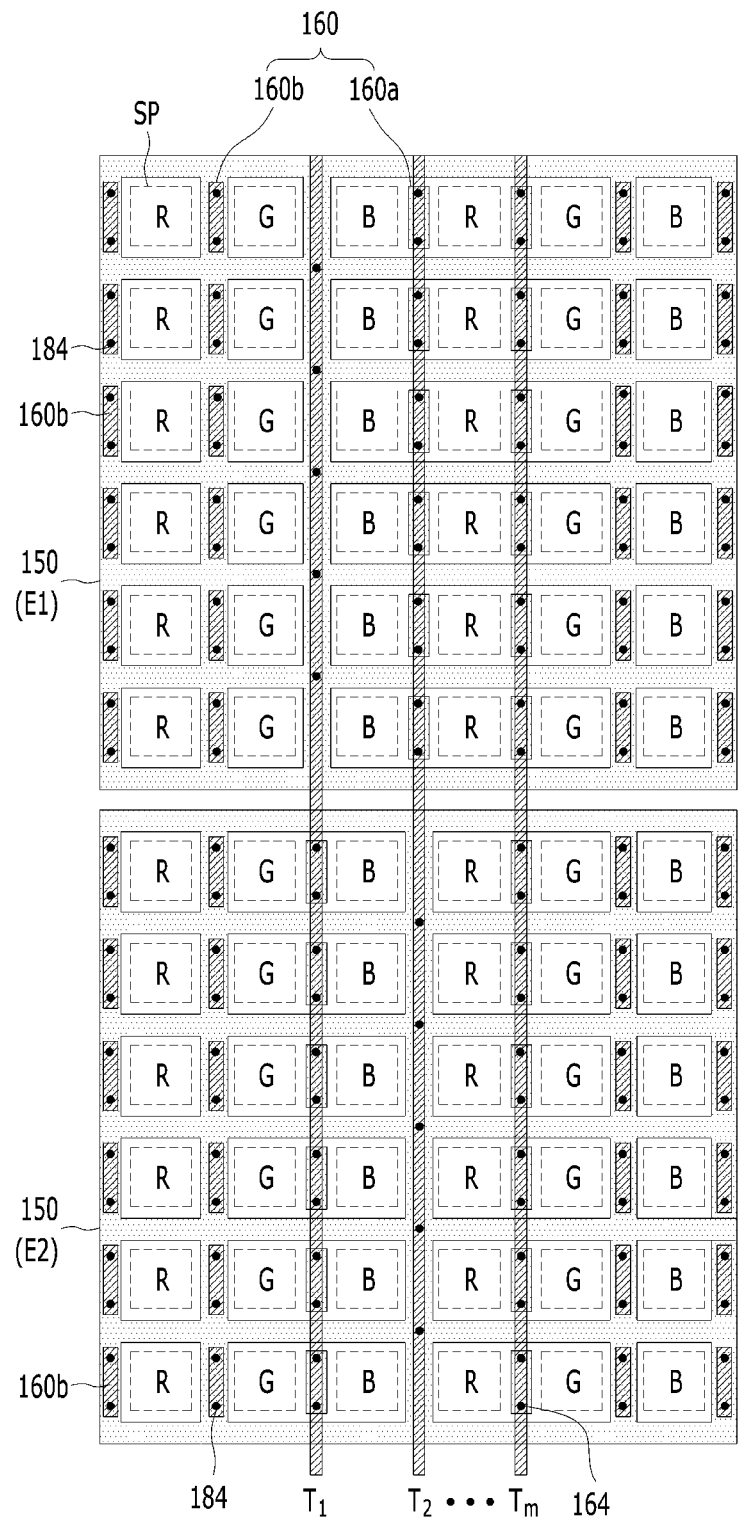
Figure 16C:
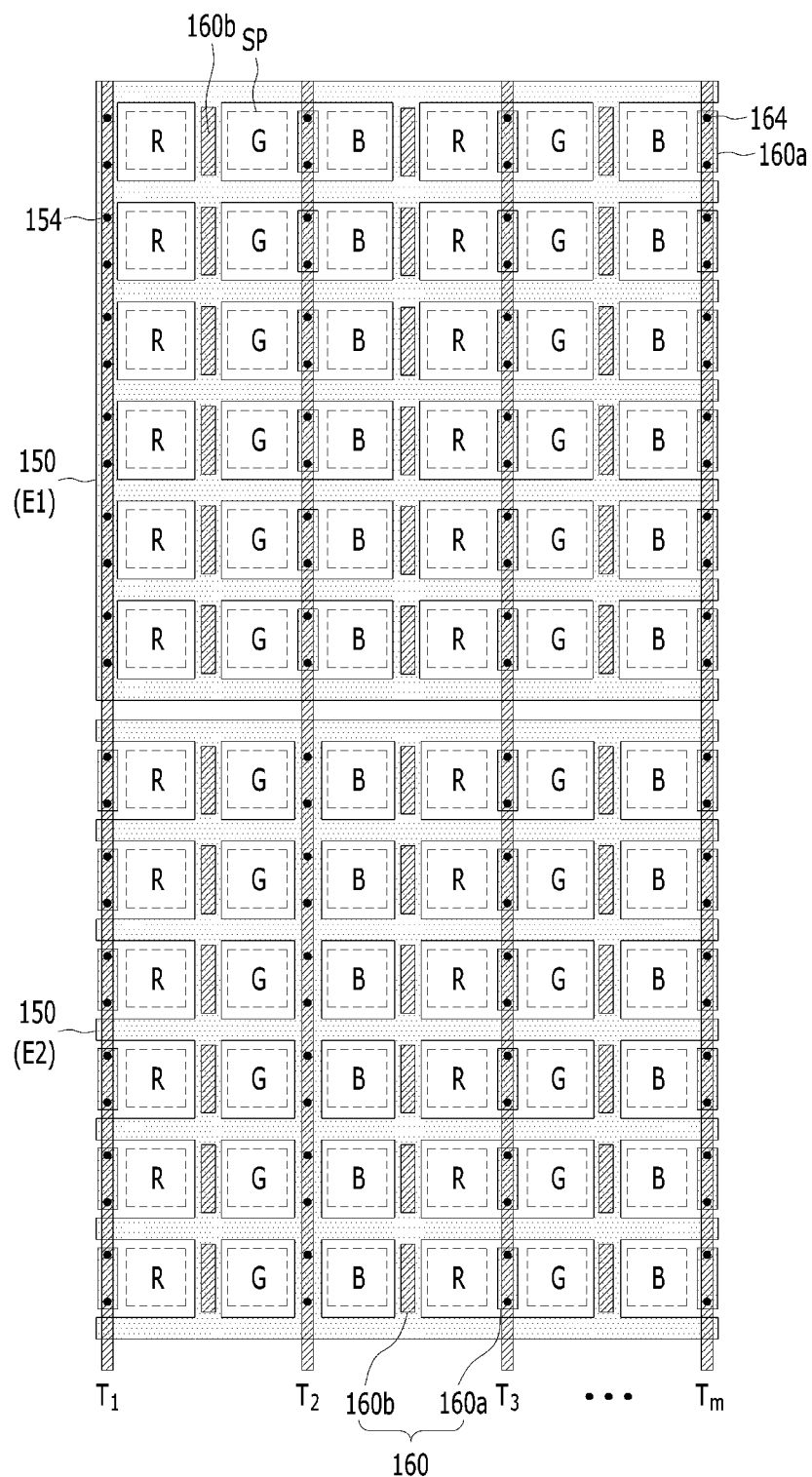
Figure 16D:
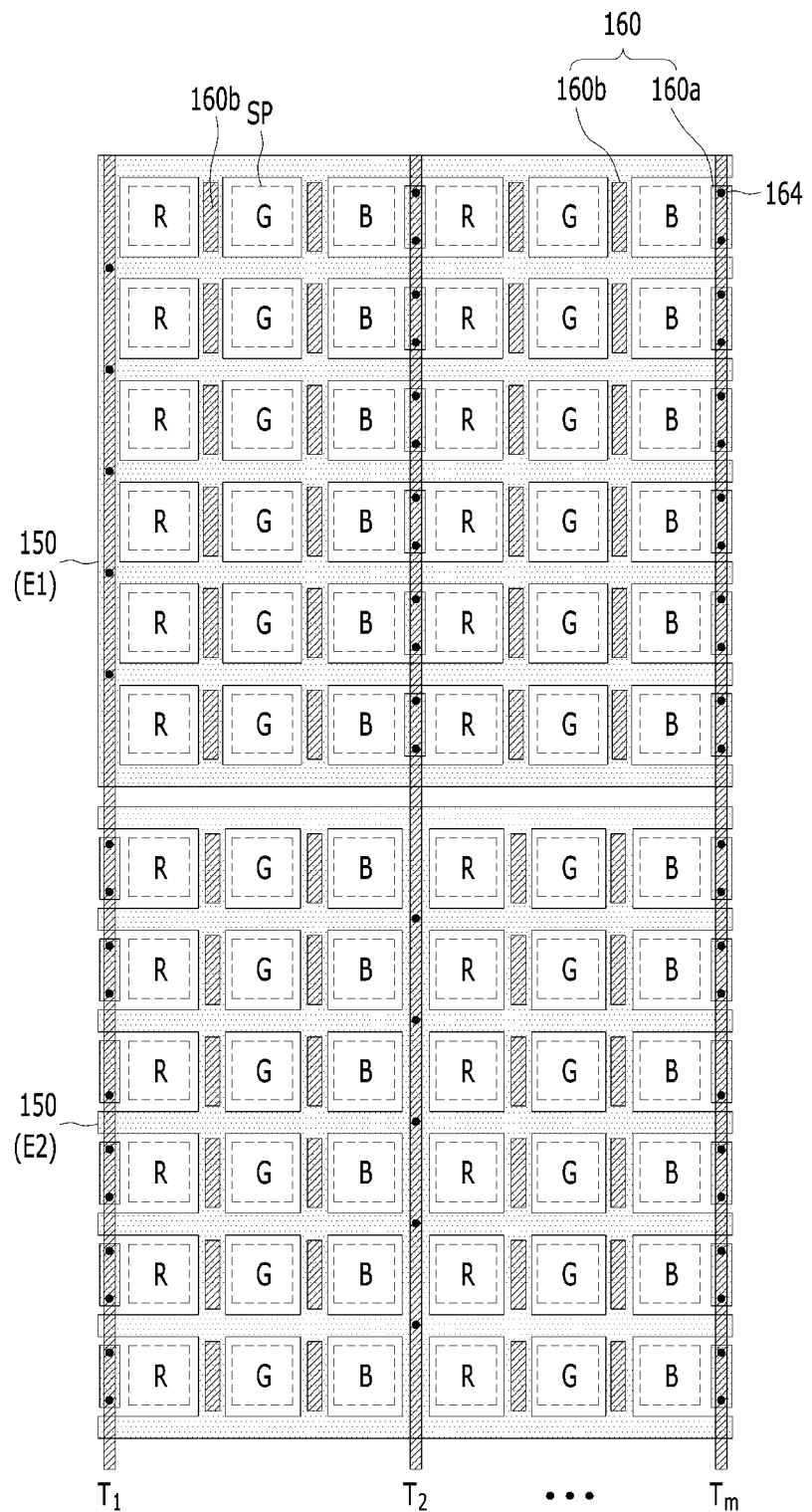
Figure 16E:
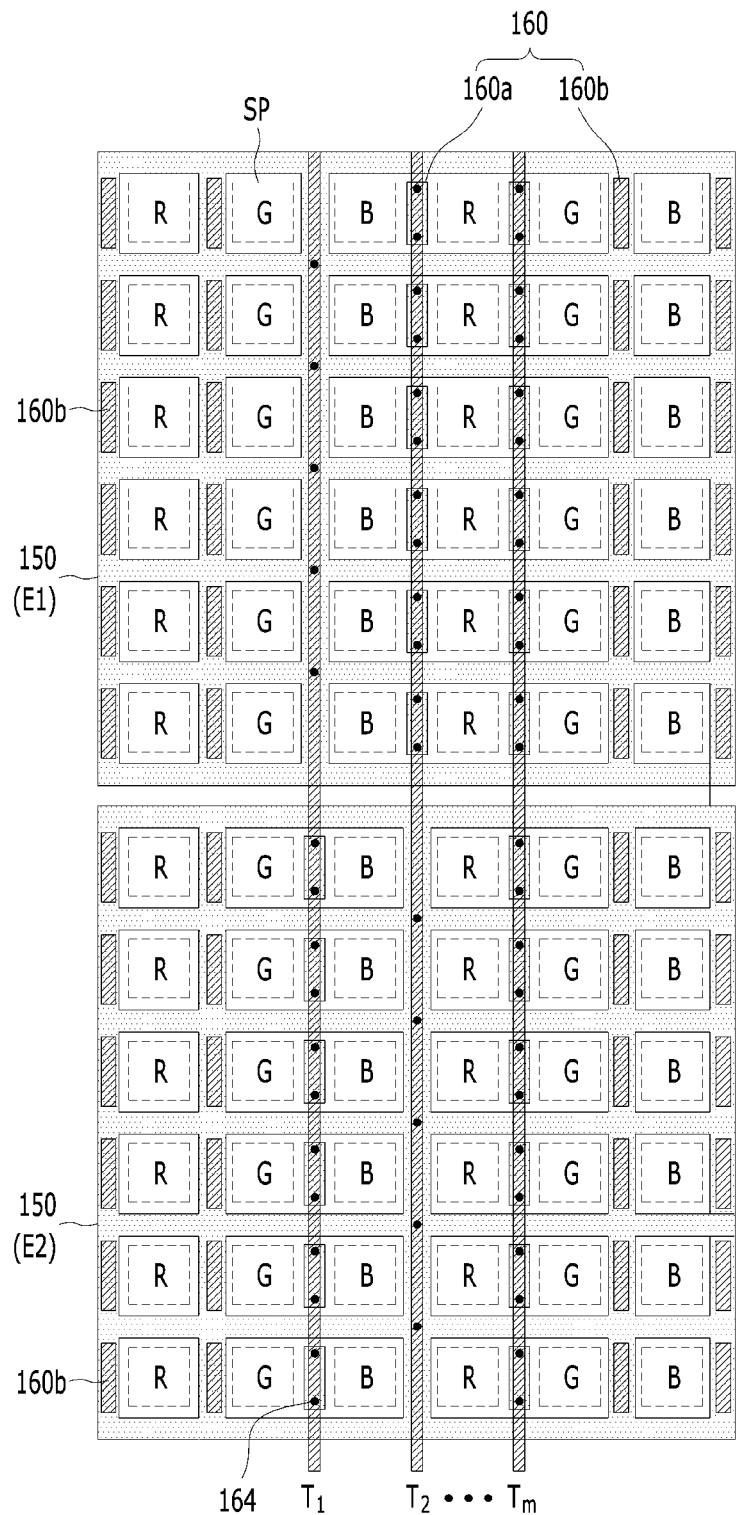

The touch lines T1, T2, . . . , and Tm are disposed per two subpixel rows at which a plurality of subpixels SP is disposed in a line in the vertical direction, as shown in FIGS. 14 and 16C, are disposed per three subpixel rows, as shown in FIGS. 16A and 16D, or are disposed so as to extend through the middle area of each touch electrode 150 excluding the left area and the right area, as shown in FIGS. 16B and 16E. The overlapping area between each of the touch lines T1, T2, . . . , and Tm and the touch electrode 150 may be reduced as much as the overlapping area between each of the touch lines T1, T2, . . . , and Tm and the first redundant electrode 160a. Consequently, it is possible to reduce parasitic capacitance between each of the touch lines T1, T2, . . . , and Tm and the touch electrode 150, whereby touch performance is improved.

Figure 17:
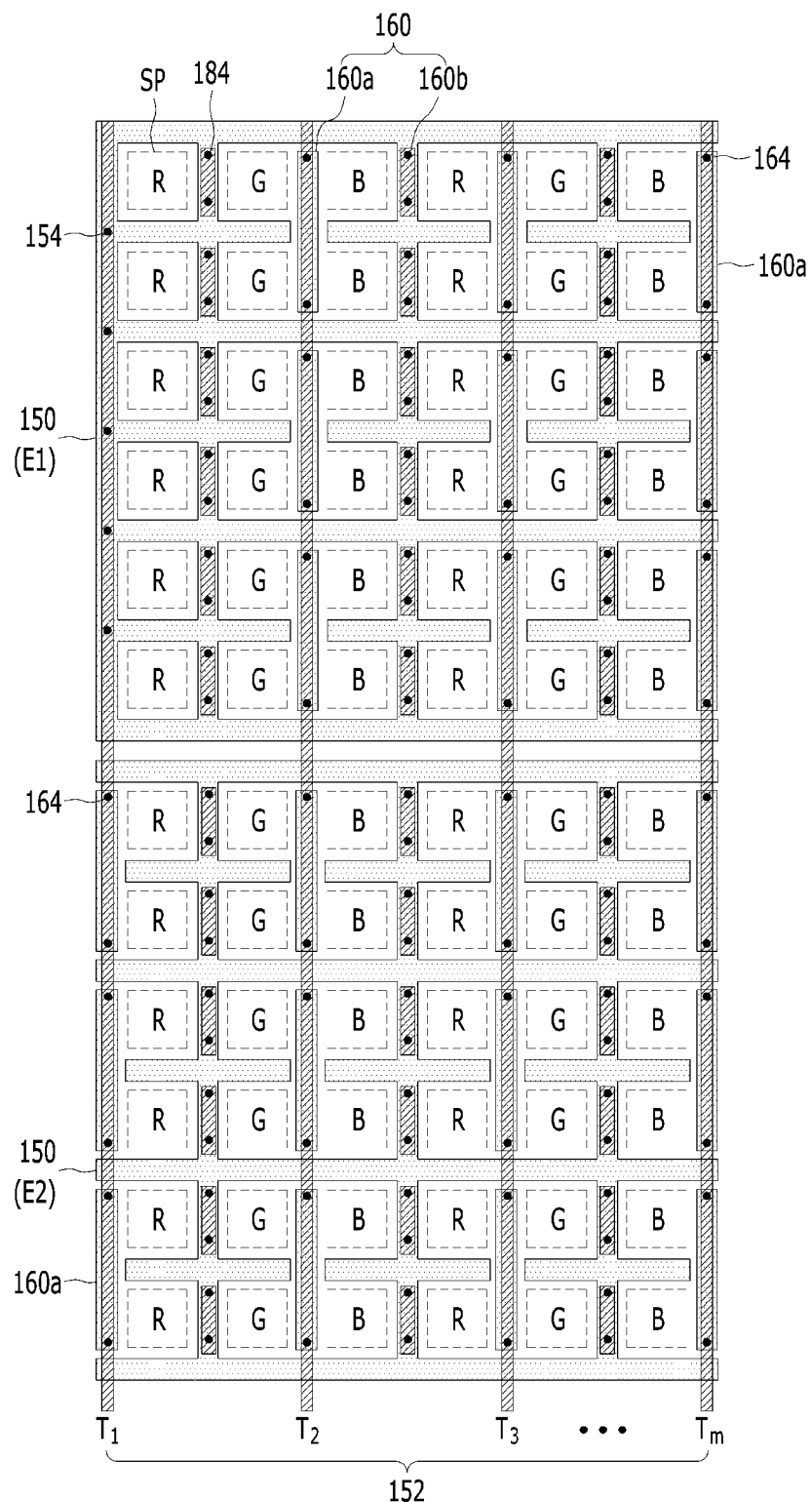
FIG. 17 is a plan view showing a fifth aspect of the touch sensor according to the present disclosure.

FIG. 17 is a plan view showing a fifth aspect of the touch sensor according to the present disclosure.

The touch sensor shown in FIG. 17 includes the same components as the touch sensor shown in FIGS. 5 and 6 except that a redundant electrode 160 includes first and second redundant electrodes 160a and 160b having different lengths. Consequently, a detailed description of the same components will be omitted.

Touch lines T1, T2, ..., and Tm are disposed per j subpixel rows (j being a natural number equal to or greater than 2) at which a plurality of subpixels SP is disposed in a line in the vertical direction. First redundant electrodes 160a disposed along the touch lines T1, T2, ..., and Tm overlap the touch lines T1, T2, ..., and Tm.

Each of the first redundant electrodes 160a has a length greater than the length of one subpixel SP and the length of each second redundant electrode 160b. For example, the first redundant electrode 160a has a length corresponding to the lengths of two subpixels SP arranged in the vertical direction, and therefore the first redundant electrode 160a is disposed per two subpixels SP arranged in the vertical direction and two subpixels SP arranged in the horizontal direction one by one.

The first redundant electrode 160a is made of the same material as a touch electrode 150, and is disposed on a touch dielectric film 158, which is disposed in the same plane as the touch electrode 150. As shown in FIG. 15, the first redundant electrode 160a is electrically connected to a touch line 152 exposed through a first redundant contact hole 164 formed through the touch dielectric film 158. The first redundant electrode 160a electrically connected to the touch line 152 has the same potential as the touch line 152, whereby no parasitic capacitance is formed between the touch line 152 and the first redundant electrode 160a. Consequently, it is possible to reduce parasitic capacitance between the touch line 152 and the touch electrode 150 in a non-contact area NCA between the touch line 152 and the touch electrode 150, whereby touch performance is improved. In addition, a plurality of first redundant electrodes 160a is electrically connected to a touch line 152, whereby the plurality of first redundant electrodes 160a is connected to the touch line 152 in parallel. Consequently, the total internal resistance of the touch line 152 is reduced, and therefore the magnitude of RC delay is reduced, whereby it is possible to reduce distortion of a touch signal transmitted through the touch line 152.

The second redundant electrode 160b has a length less than the length of the first redundant electrode 160a. For example, the second redundant electrode 160b has a length corresponding to the length of one of the subpixels SP arranged in the vertical direction, and therefore the second redundant electrode 160b is disposed per subpixel SP arranged in the vertical direction and two subpixels SP arranged in the horizontal direction one by one. The second redundant electrode 160b is disposed so as to overlap the touch electrode 150 that does not overlap the touch lines T1, T2, ..., and Tm. The second redundant electrode 160b is made of the same material as the touch lines T1, T2, ..., and Tm, and is disposed in the same plane as the touch lines T1, T2, ..., and Tm. For example, the second redundant electrode 160b is disposed on a touch buffer layer 148 and an encapsulation unit 140, and is disposed in a different plane from the first redundant electrode 160a. The second redundant electrode 160b is exposed through a second redundant contact hole 184 formed through the touch dielectric film 158, and is electrically connected to the touch electrode 150. The second redundant electrode 160b electrically connected to the touch electrode 150 has the same potential as the touch electrode 150, whereby no parasitic capacitance is formed between the touch electrode 150 and the second redundant electrode 160b. Consequently, it is possible to reduce parasitic capacitance between the touch electrode 150 and the second redundant electrode 160b in a non-contact area NCA between the touch electrode 150 and the second redundant electrode 160b, whereby touch performance is improved. In addition, a plurality of second redundant electrodes 160b is electrically connected to a touch electrode 150, whereby the plurality of second redundant electrodes 160b is connected to the touch electrode 150 in parallel. Consequently, the total internal resistance of the touch electrode 150 is reduced, and therefore the magnitude of RC delay is reduced, whereby it is possible to reduce distortion of a touch signal transmitted through the touch electrode 150.

Figure 18A:
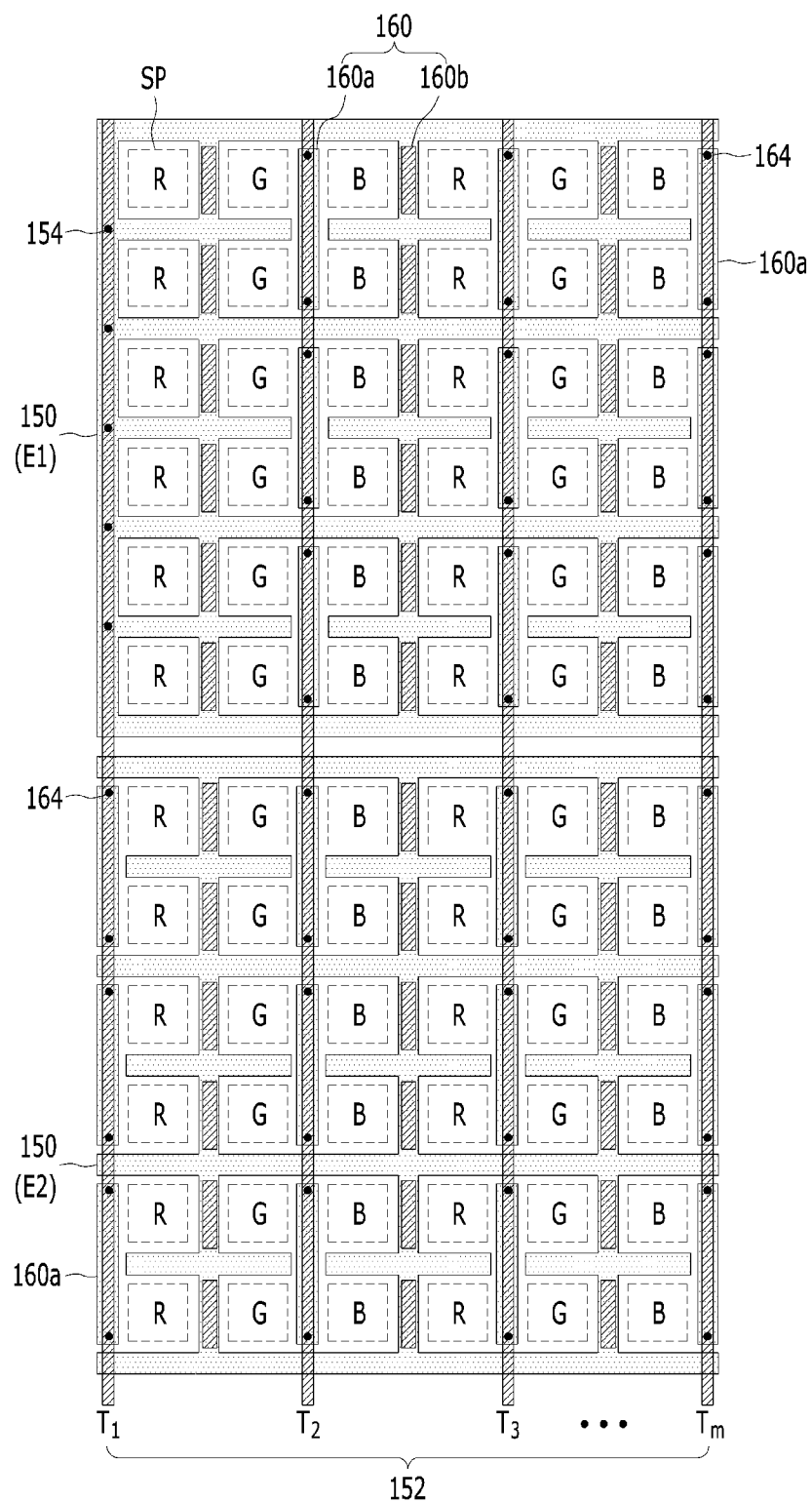
FIGS. 18A and 18B are plan views showing dispositional relationships between a touch electrode, a subpixel, and a touch line shown in FIG. 17.
Figure 18B:
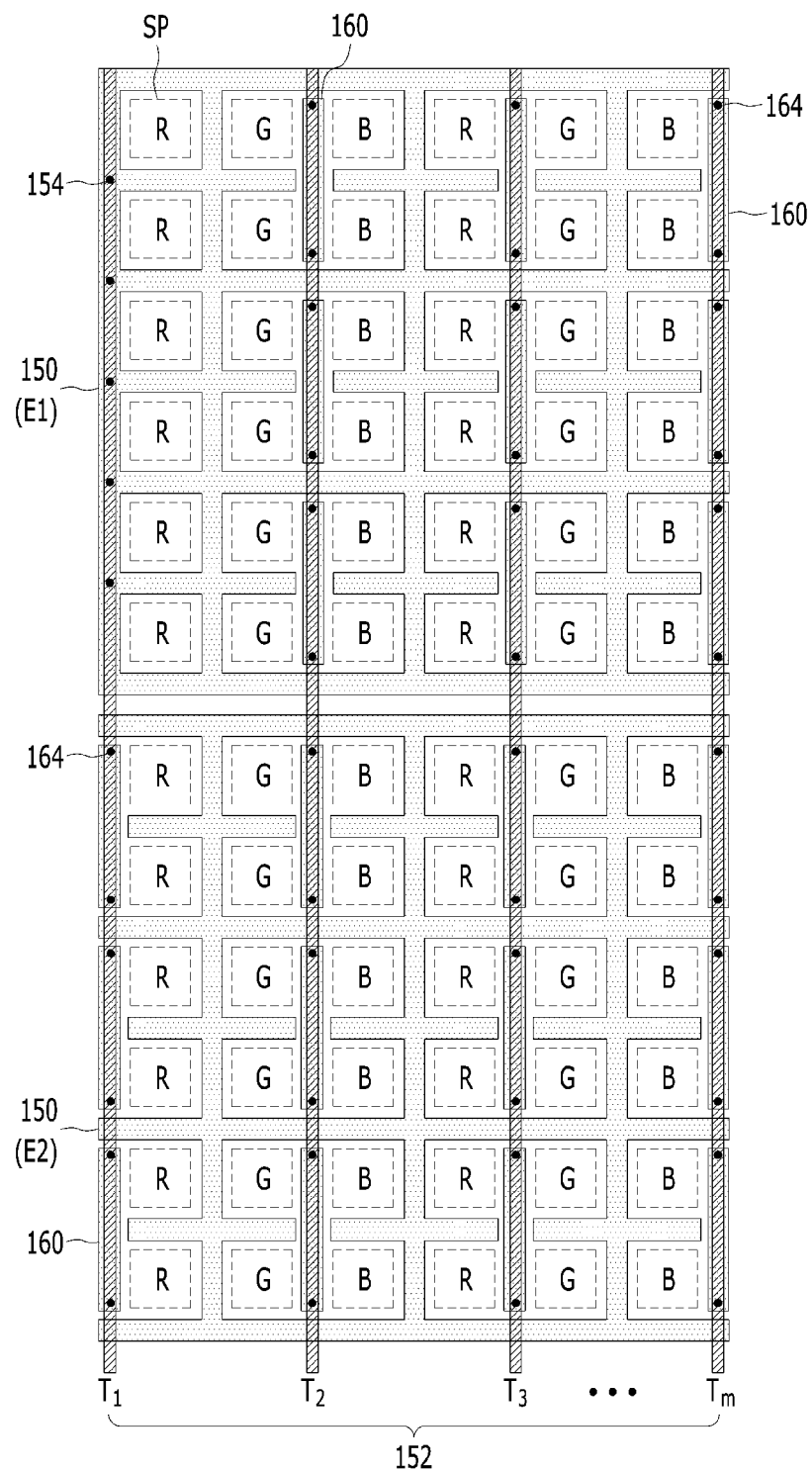

Furthermore, at least one of the first and second redundant electrode 160a and 160b may be formed in a floating state, as shown in FIG. 18A. For example, the second redundant electrode 160b may be formed in a floating state in which the second redundant electrode 160b is electrically separated from the touch electrode 150, whereby no signal is applied thereto. In addition, as shown in FIG. 18B, the redundant electrode 160 may be constituted by only the first redundant electrode 160a without the second redundant electrode 160b.

Figure 19:
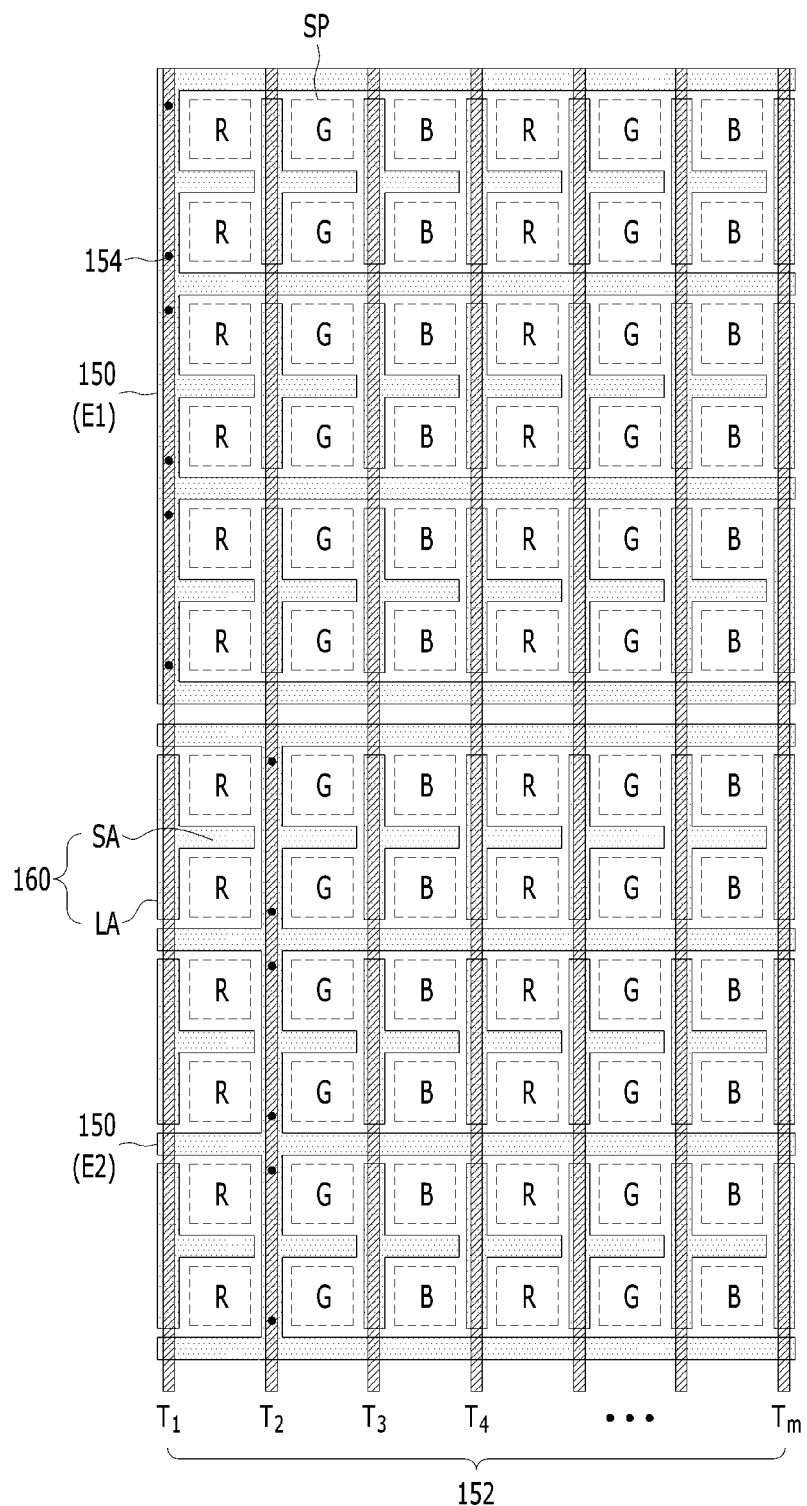
FIG. 19 is a plan view showing a sixth aspect of the touch sensor according to the present disclosure.
Figure 20:
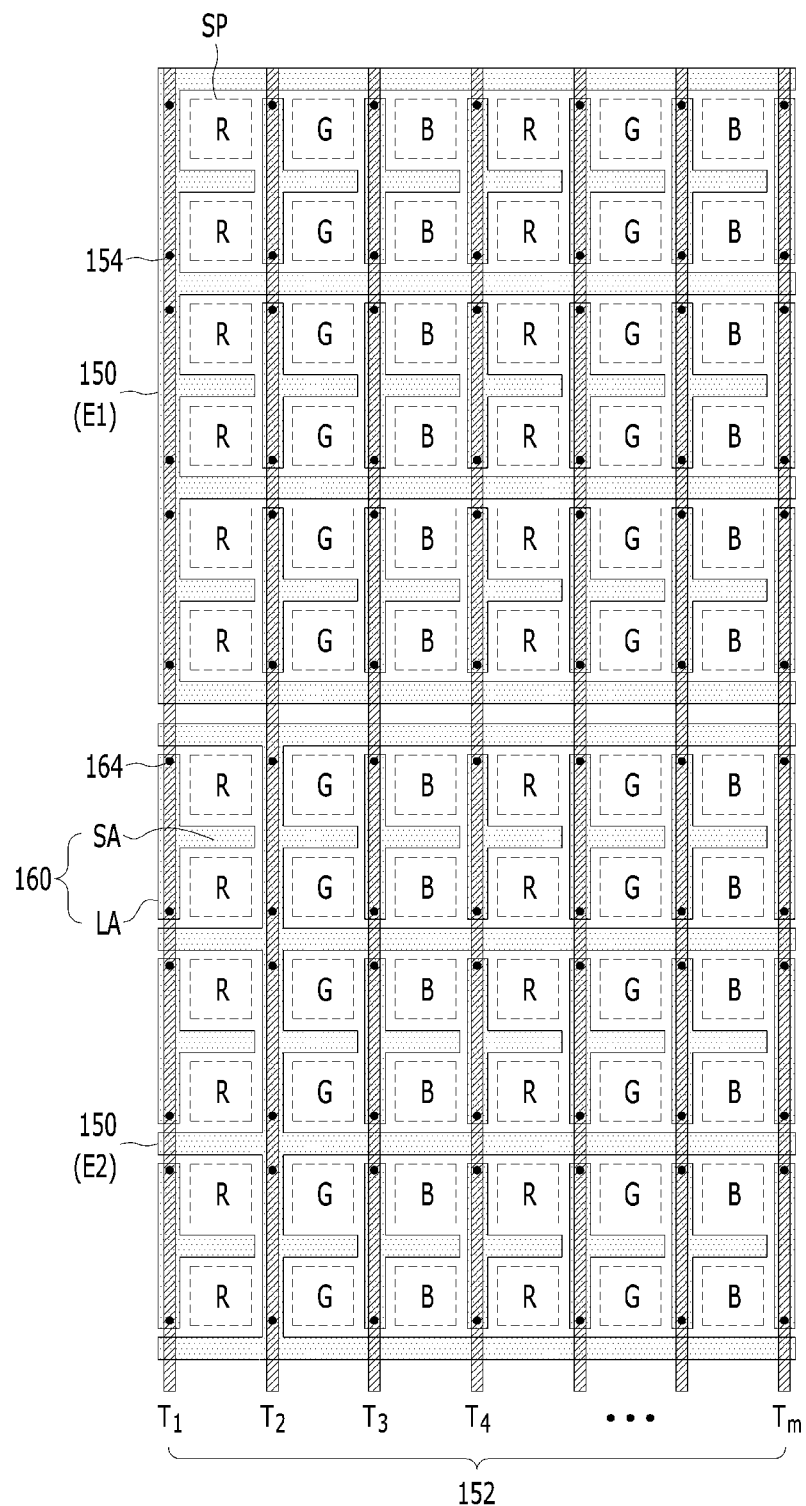
FIG. 20 is a plan view showing the sixth aspect of the touch sensor according to the present disclosure including a redundant contact hole.

FIGS. 19 and 20 are plan views showing a sixth aspect of the touch sensor according to the present disclosure.

The touch sensor shown in FIGS. 19 and 20 includes the same components as the touch sensor shown in FIGS. 5 and 6 except that a redundant electrode includes a long side and a short side. Consequently, a detailed description of the same components will be omitted.

A redundant electrode 160 includes a long-side area LA and a short-side area SA. The long-side area LA is disposed per two subpixels arranged along a touch line in the vertical direction, and therefore the long-side area LA has a length corresponding to the lengths of two subpixels SP arranged in the vertical direction. The short-side area SA protrudes from the long-side area LA between two subpixels arranged in the vertical direction. The redundant electrode 160 including the long-side area and the short-side area is formed in a T-shape.

The redundant electrode 160 is made of the same material as a touch electrode 150, and is disposed on a touch dielectric film 158, which is disposed in the same plane as the touch electrode 150. As shown in FIG. 15, the redundant electrode 160 is electrically connected to a touch line 152 exposed through a first redundant contact hole 164 formed through the touch dielectric film 158. The redundant electrode 160 electrically connected to the touch line 152 has the same potential as the touch line 152, whereby no parasitic capacitance is formed between the touch line 152 and the redundant electrode 160. Consequently, it is possible to reduce parasitic capacitance between the touch line 152 and the touch electrode 150 in a non-contact area NCA between the touch line 152 and the touch electrode 150, whereby touch performance is improved. In addition, a plurality of redundant electrodes 160 is electrically connected to a touch line 152, whereby the plurality of redundant electrodes 160 is connected to the touch line 152 in parallel. Consequently, the total internal resistance of the touch line 152 is reduced, and therefore the magnitude of RC delay is reduced, whereby it is possible to reduce distortion of a touch signal transmitted through the touch line 152.

Furthermore, the redundant electrode 160 may be formed in a floating state, as shown in FIG. 20. For example, the redundant electrode 160 may be formed in a floating state in which the redundant electrode 160 is electrically separated from the touch electrode 150, whereby no signal is applied thereto.

Figure 21:
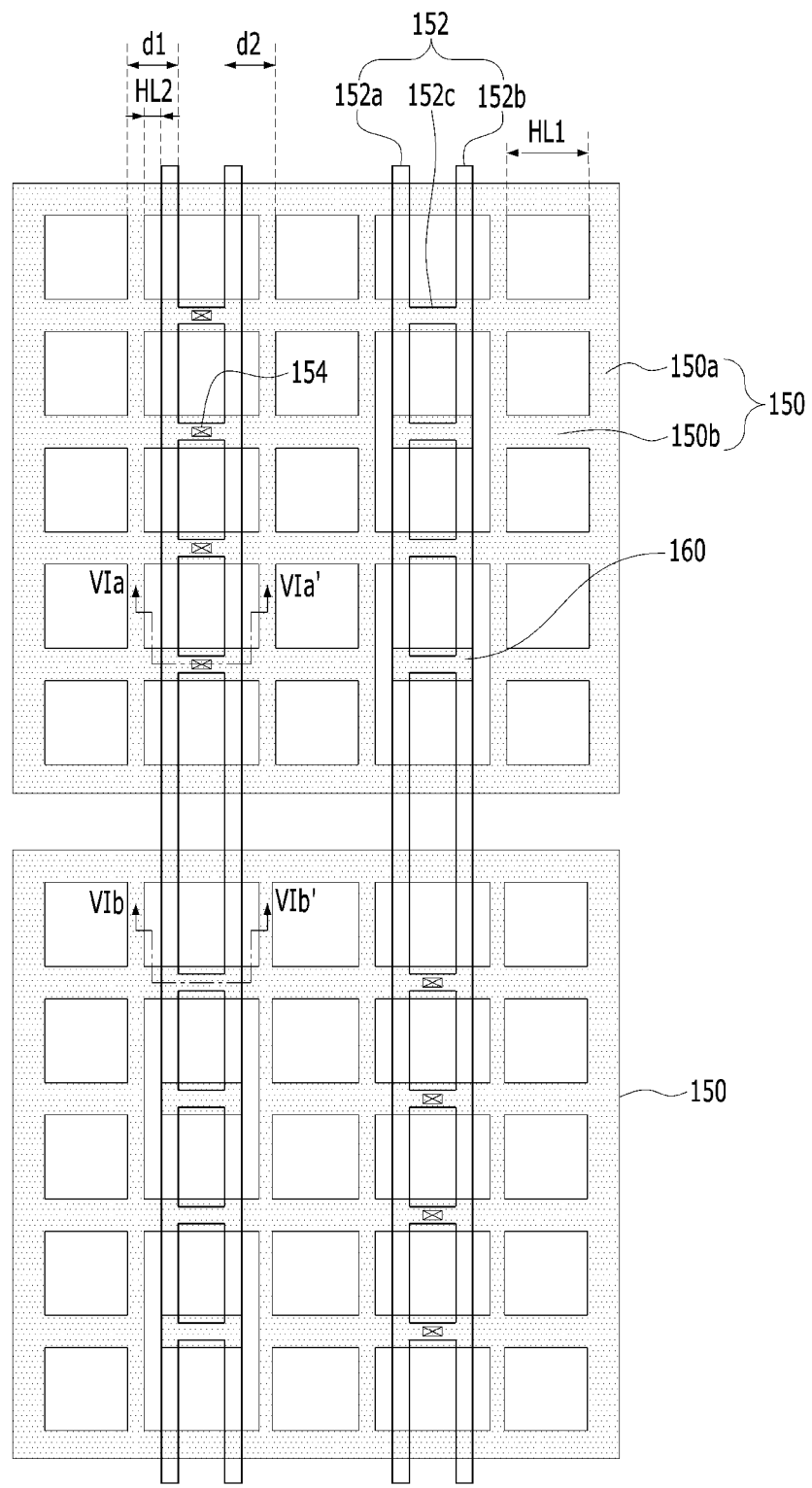
FIG. 21 is a plan view showing a seventh aspect of the touch sensor according to the present disclosure.
Figure 22:
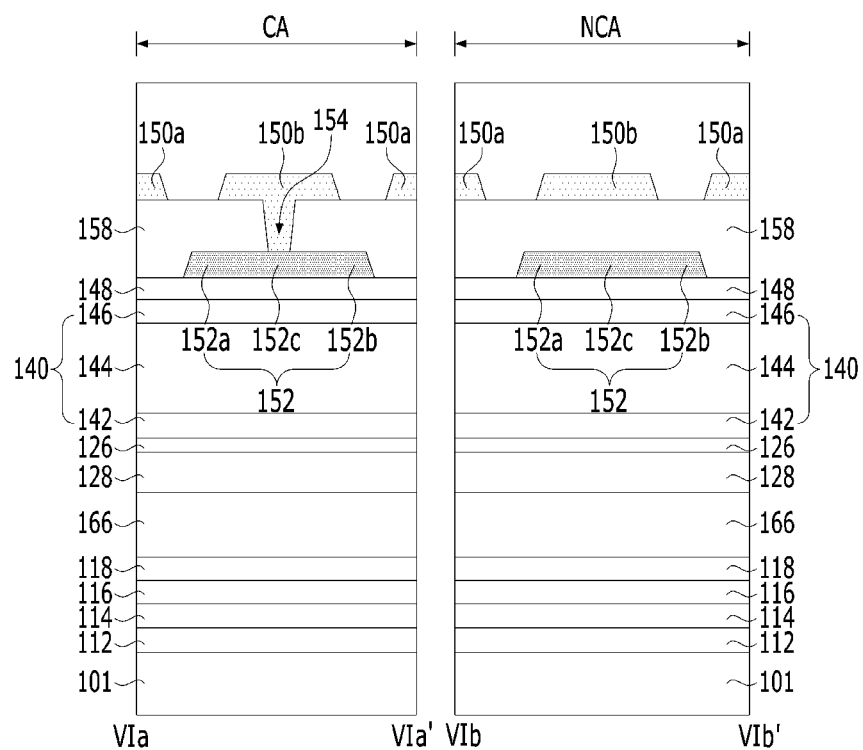
FIG. 22 is a cross-sectional view of the touch display device taken along lines VIa-VIa' and VIb-VIb' of FIG. 21.

FIGS. 21 and 22 are a plan view and a cross-sectional view showing a seventh aspect of the touch sensor according to the present disclosure.

The touch sensor shown in FIGS. 21 and 22 includes the same components as the touch sensor shown in FIGS. 5 and 6 except that a touch line 152 is formed in a mesh shape.

The touch line 152 shown in FIGS. 21 and 22 is formed in a mesh shape using first to third touch lines 152a, 152b, and 152c.

The first and second touch lines 152a and 152b are formed parallel to a first electrode portion 150a of a touch electrode 150. The third touch line 152c is formed between the first and second touch lines 152a and 152b so as to overlap at least one of a second electrode portion 150a of the touch electrode 150 and a redundant electrode 160.

At this time, each of the first to third touch lines 152a, 152b, and 152c is formed so as to have a smaller line width than a bank 128 disposed in a non-emission area and to overlap the bank 128. For example, the line width of at least one of the first and second touch line 152a and 152b and the line width of the first electrode portion 150a are formed so as to be less than the line width of the second electrode portion 150b. In this case, the distance d1 between one side (i.e., left side) of the first electrode portion 150a of the touch electrode 150 and the other side (i.e., right side) of the neighboring first touch line 152a is formed so as to be less than the line width of the bank 128, and the distance d2 between the other side (i.e., right side) of the first electrode portion 150a of the touch electrode 150 and one side (i.e., left side) of the neighboring second touch line 152b is formed so as to be less than the line width of the bank 128. Consequently, the first and second touch lines 152a and 152b overlap the bank 128, whereby it is possible to prevent deterioration in an aperture ratio due to the first and second touch lines 152a and 152b.

In addition, the horizontal distance HL2 between the redundant electrode 160 and the first electrode portion 150a is formed so as to be less than the horizontal distance HL1 between the first electrode portions 150a. At this time, the horizontal distance HL2 between the redundant electrode 160 and the first electrode portion 150a overlaps the bank 128, and the redundant electrode 160 is disposed in a line with the first electrode portion 150a of the touch electrode extending in the first direction, whereby it is possible to prevent the redundant electrode 160 from being seen.

Only the second electrode portion 150b of the touch electrode 150, excluding the first electrode portion 150a, overlaps the touch line 152. At this time, the second electrode portion 150b of the touch electrode 150 is connected to the touch line 152 exposed through a touch contact hole 154 formed through a touch dielectric film 158 in a contact area CA with the touch line 152.

In addition, the mesh-shaped touch line 152 overlaps at least one of the redundant electrode 160 and the second electrode portion 150b of the touch electrode 150, excluding the first electrode portion 150a, whereby the overlapping area between the touch line 152 and the touch electrode 150 is minimized. Consequently, it is possible to reduce parasitic capacitance between the touch line 152 and the touch electrode 150 in a non-contact area NCA between the touch line 152 and the touch electrode 150, whereby touch performance is improved.

Figure 23:
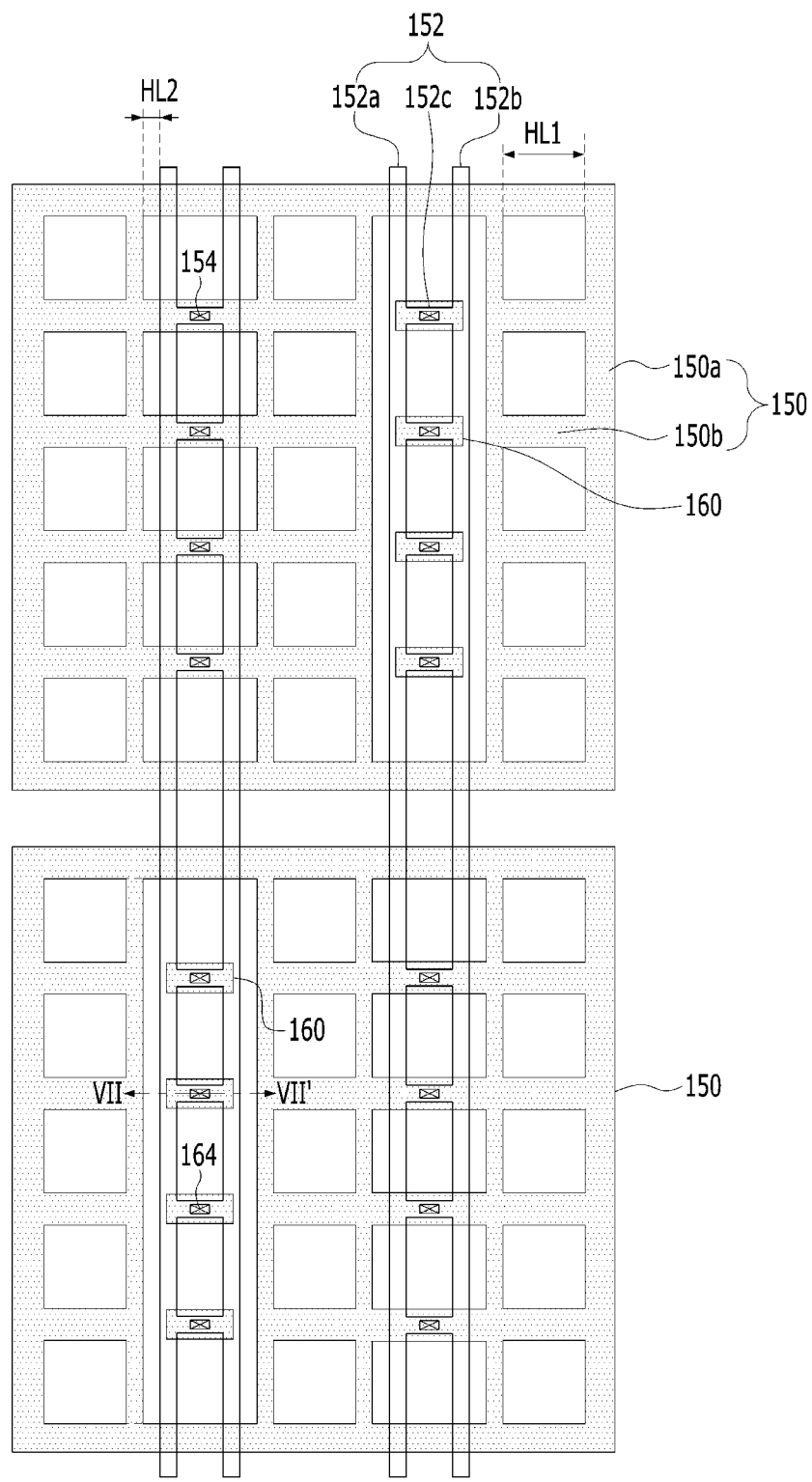
FIG. 23 is a plan view showing an eighth aspect of the touch sensor according to the present disclosure.
Figure 24:
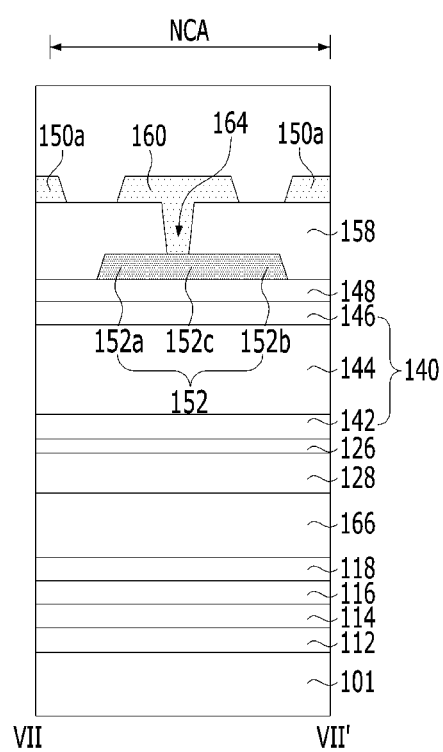
FIG. 24 is a cross-sectional view of the touch display device taken along line VII-VII' of FIG. 23.

FIGS. 23 and 24 are a plan view and a cross-sectional view showing an eighth aspect of the touch sensor according to the present disclosure.

The touch sensor shown in FIGS. 23 and 24 includes the same components as the touch sensor shown in FIGS. 21 and 22 except that a touch line 152 contacts an independent redundant electrode 160. Consequently, a detailed description of the same components will be omitted.

The redundant electrode 160 is electrically connected to a touch line 152 exposed through a redundant contact hole 164 formed through a touch dielectric film 158, whereby no parasitic capacitance is formed between the touch line 152 and the redundant electrode 160. Consequently, it is possible to reduce parasitic capacitance between the touch line 152 and a touch electrode 150 in a non-contact area NCA between the touch line 152 and the touch electrode 150, whereby touch performance is improved.

In addition, a plurality of redundant electrodes 160 is electrically connected to a touch line 152, whereby the plurality of redundant electrodes 160 is connected to the touch line 152 in parallel. Consequently, the total internal resistance of the touch line 152 is reduced, and therefore the magnitude of RC delay is reduced, whereby it is possible to reduce distortion of a touch signal transmitted through the touch line 152.

Furthermore, the plurality of redundant electrodes 160 is electrically connected to the touch line 152 to form multiple paths. Consequently, the redundant electrodes 160 may be used as redundancy in case of breakage of the touch line 152, whereby it is possible to improve yield.

Figure 25:
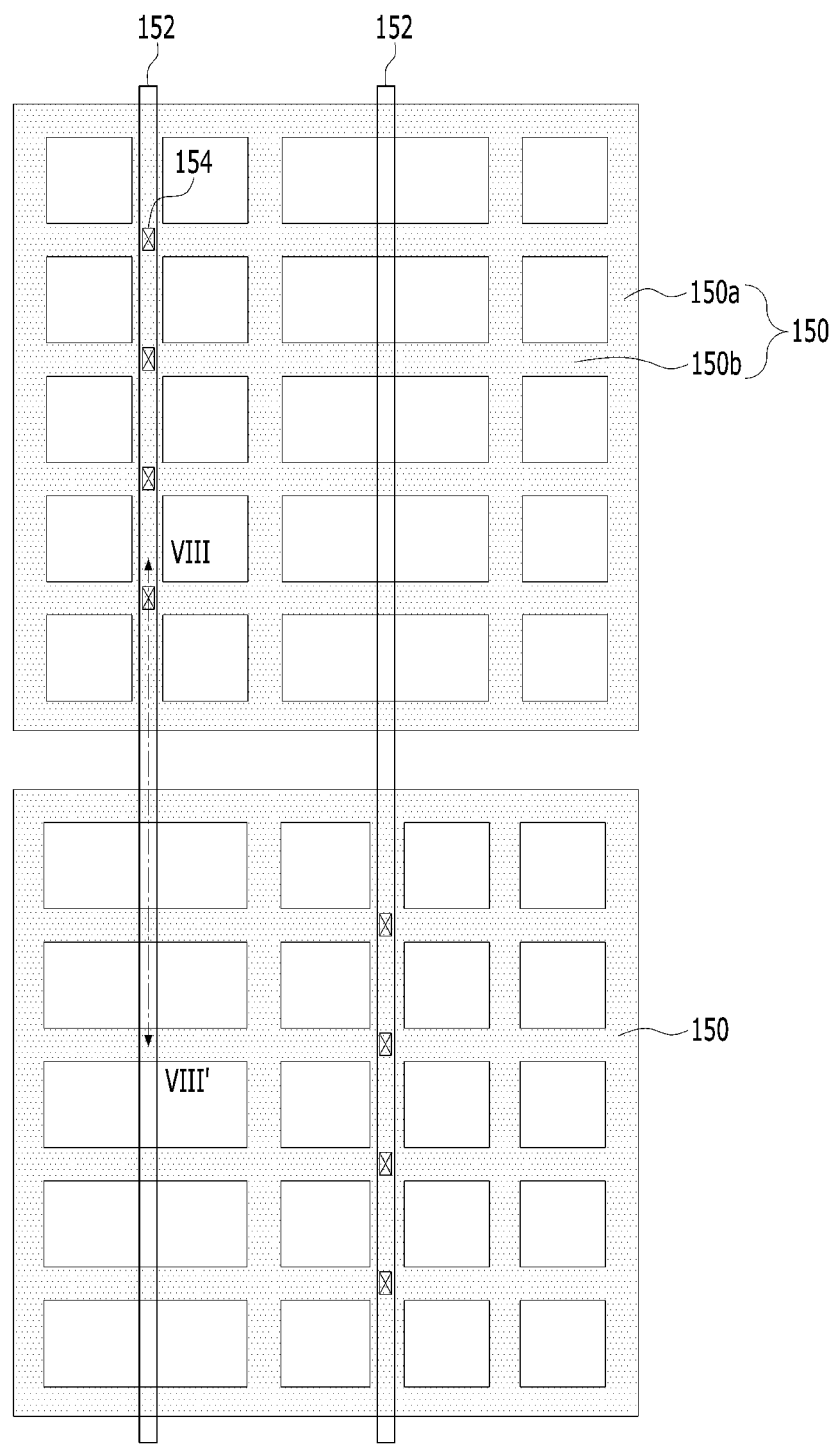
FIG. 25 is a plan view showing a ninth aspect of the touch sensor according to the present disclosure.
Figure 26:
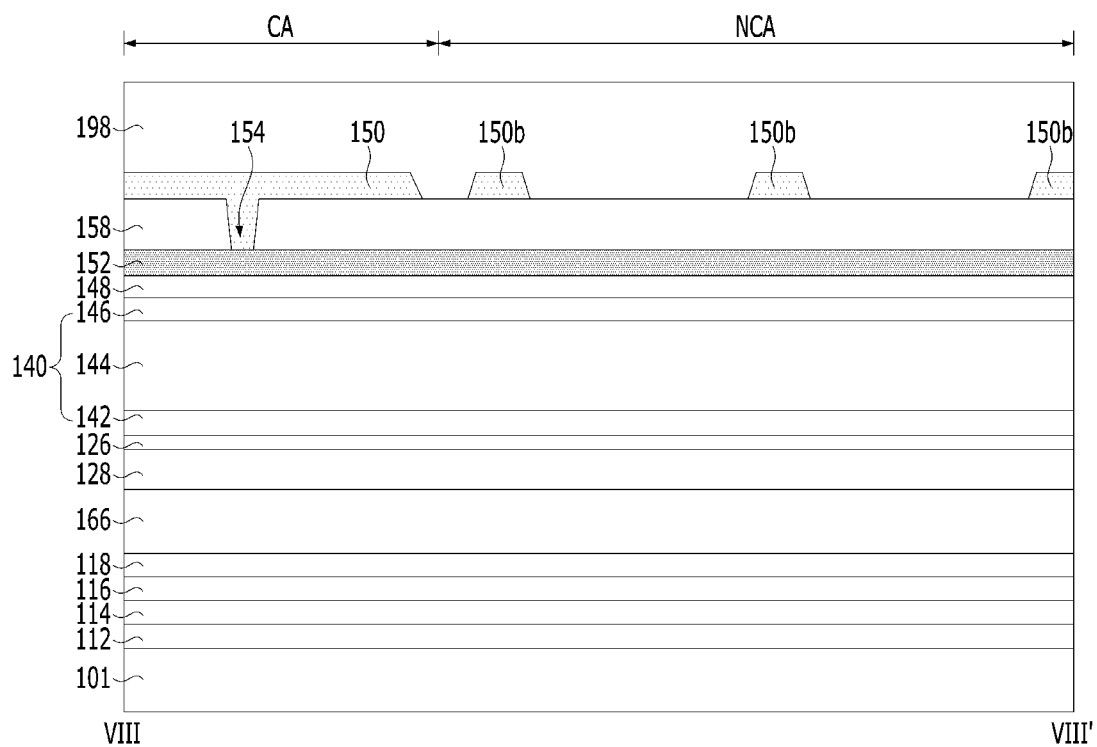
FIG. 26 is a cross-sectional view of the touch display device taken along line VIII-VIII' of FIG. 25.

FIGS. 25 and 26 are a plan view and a cross-sectional view showing a ninth aspect of the touch sensor according to the present disclosure.

The touch sensor shown in FIGS. 25 and 26 includes the same components as the touch sensor shown in FIGS. 5 and 6 except that no redundant electrode is included. Consequently, a detailed description of the same components will be omitted.

A touch line 152 shown in FIGS. 25 and 26 is exposed through a touch contact hole 154 formed through a touch dielectric film 158 in a contact area CA with a touch electrode 150, and is connected to the touch electrode 150.

In addition, the touch line 152 is disposed so as to intersect the touch electrode 150 in a non-contact area NCA. That is, the touch line 152 does not overlap a first electrode portion 150a of the touch electrode 150 but overlaps a second electrode portion 150b of the touch electrode 150 in the non-contact area NCA. Consequently, it is possible to reduce parasitic capacitance between the touch line 152 and the touch electrode 150 in the non-contact area NCA between the touch line 152 and the touch electrode 150, whereby RC delay is reduced and thus touch performance is improved.

Figure 27A:
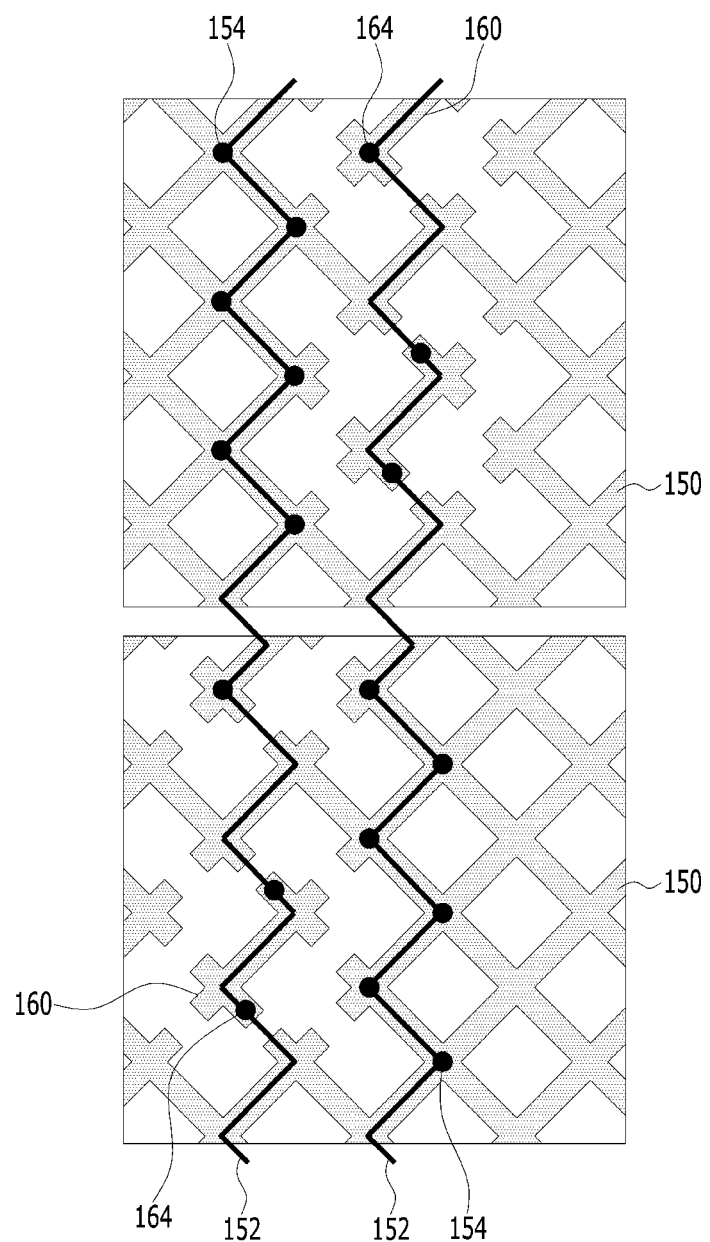
FIGS. 27A and 27B are plan views showing other aspects of the touch line and the touch electrode according to the present disclosure.
Figure 27B:
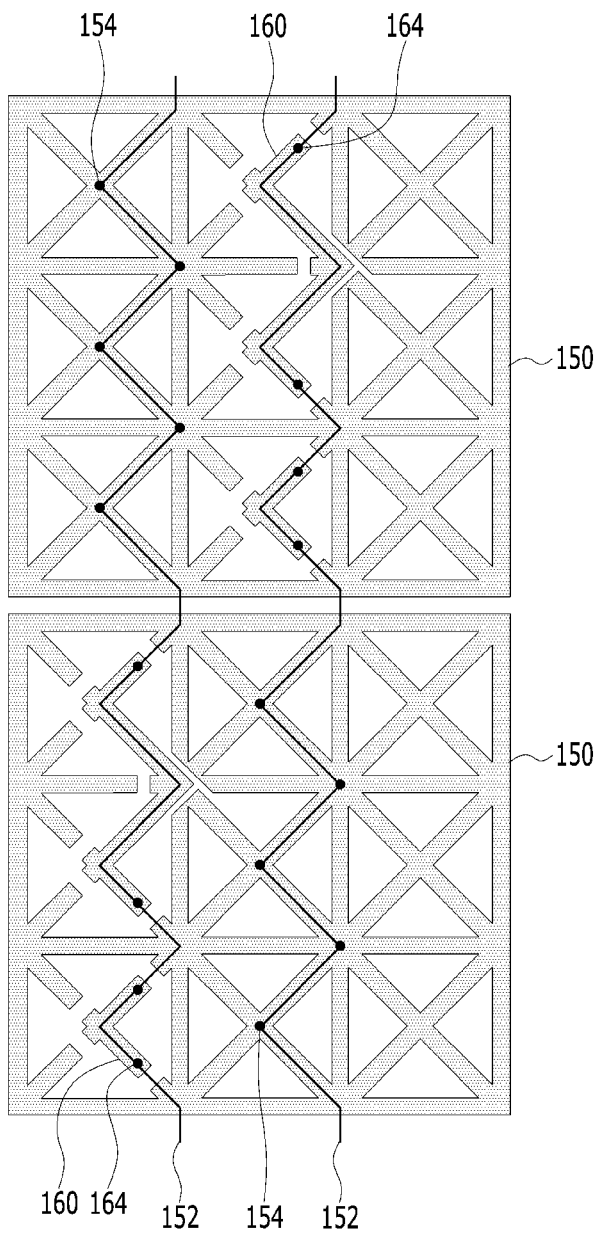

Meanwhile, in the present disclosure, the structure in which the touch line 152 is formed in a stripe shape has been described by way of example. Alternatively, as shown in FIGS. 27A and 27B, the touch line 152 may be formed in a zigzag shape depending on the shape of the bank 128. In this case, a redundant electrode 160 shown in FIGS. 27A and 27B is separated from a touch electrode, and is electrically connected to the touch line 152 through a redundant contact hole 164. The touch electrode 150, the redundant electrode 160, and the touch line 152 are formed so as to overlap the bank.

Also, in the present disclosure, the structure in which the unit pixel includes red (R), green (G), and blue (B) subpixels SP has been described by way of example. Alternatively, the unit pixel may include red (R), green (G), blue (B), and white (W) subpixels SP, may include one red (R) subpixel SP, two green (G) subpixels SP, and one blue (B) subpixel SP, or may include one red (R) subpixel SP, one green (G) subpixel SP, and two blue (B) subpixels SP.

As is apparent from the above description, in the present disclosure, the touch line overlaps the redundant electrode spaced apart from the touch electrode in the non-contact area between the touch line and the touch electrode, and therefore it is possible to reduce the overlapping area between the touch line and the touch electrode, whereby it is possible to reduce parasitic capacitance between the touch line and the touch electrode.

Also, in the present disclosure, the touch line overlaps the redundant electrode having the same potential as the touch line in the non-contact area between the touch line and the touch electrode. Consequently, it is possible to reduce resistance of the touch line and parasitic capacitance, whereby RC delay is reduced and thus deterioration in touch performance is prevented.

Furthermore, in the present disclosure, the touch line is electrically connected to the plurality of redundant electrodes to form multiple paths in the non-contact area between the touch line and the touch electrode. Consequently, the redundant electrodes serve to prevent breakage of the touch line, whereby it is possible to reduce defects and to improve yield.

The above description merely illustrates the present disclosure, and it will be apparent to those skilled in the art that various modifications and variations can be made in the present disclosure without departing from the technical idea of the present disclosure. Therefore, the aspects disclosed in the specification of the present disclosure do not limit the present disclosure. The scope of the present disclosure should be interpreted by the following claims, and all technical concepts included in a range equivalent thereto should be interpreted as falling within the scope of the present disclosure.

What is claimed is:

1. A touch display device comprising:
   a unit pixel disposed on a substrate and comprising a plurality of subpixels;
   a light-emitting element disposed at each of the plurality of subpixels;
   an encapsulation unit disposed on the light-emitting element;
   a plurality of touch electrodes disposed on the encapsulation unit, each of the plurality of touch electrodes having first and second electrode portions intersecting each other to form a mesh shape and having a plurality of first opening areas and a plurality of second opening areas defined by the first and second electrode portions;
   a plurality of touch lines connected to the plurality of touch electrodes; and
   a plurality of redundant electrodes disposed in the plurality of first opening areas so as to space from each of the plurality of touch electrodes,
   wherein the plurality of redundant electrodes overlap with the plurality of touch lines.

2. The touch display device according to claim 1, wherein the plurality of redundant electrodes are disposed along the plurality of touch lines.

3. The touch display device according to claim 1,
   wherein each of the plurality of redundant electrodes is disposed parallel to at least one of the first electrode portion and the second electrode portion of each of the plurality of touch electrodes between the first electrode portions or between the second electrode portions.

4. The touch display device according to claim 3, further comprising a bank defining an emission area of the light-emitting element,
   wherein the first and second electrode portions and each of the plurality of redundant electrodes overlap with the bank.

5. The touch display device according to claim 1, wherein some of the plurality of redundant electrodes electrically float.

6. The touch display device according to claim 1, wherein some of the plurality of redundant electrodes are electrically connected to one of the plurality of touch lines.

7. The touch display device according to claim 1, wherein the plurality of touch lines are disposed parallel to each other in a state in which at least one of the plurality of subpixels is interposed therebetween.

8. The touch display device according to claim 7, wherein the plurality of redundant electrodes are disposed in units of at least one subpixel arranged in a vertical direction.

9. The touch display device according to claim 8, wherein each of the plurality of redundant electrodes comprises:
   a long-side area having a same length as the two subpixels arranged in the vertical direction; and
   a short-side area protruding from the long-side area in a horizontal direction.

10. The touch display device according to claim 1, wherein the plurality of touch lines are disposed to extend through middle areas of the plurality of touch electrodes excluding left and right areas thereof.

11. The touch display device according to claim 1, wherein each of the plurality of redundant electrodes is made of a same material as the plurality of touch electrodes and is disposed in a same plane as the plurality of touch electrodes.

12. The touch display device according to claim 1, wherein the plurality of redundant electrodes comprise:
   a first redundant electrode electrically connected to the touch lines; and
   a second redundant electrode spaced apart from the first redundant electrode and electrically floating.

13. The touch display device according to claim 12, wherein the first and second redundant electrodes are made of a same material as the plurality of touch electrodes and are disposed in a same plane as the plurality of touch electrodes.

14. The touch display device according to claim 1, wherein the plurality of redundant electrodes comprise:
   a plurality of first redundant electrodes overlapping with the plurality of touch lines; and
   a plurality of second redundant electrodes overlapping with the plurality of touch electrodes.

15. The touch display device according to claim 14, wherein the first redundant electrodes are made of a same material as the plurality of touch electrodes and are disposed in a same plane as the plurality of touch electrodes, and
   wherein the second redundant electrodes are made of a same material as the plurality of touch lines and are disposed in a same plane as the plurality of touch lines.

16. The touch display device according to claim 1, wherein the plurality of touch lines are formed in a stripe shape, a zigzag shape, or a mesh shape along an emission area of the light-emitting element.

17. The touch display device according to claim 1, wherein:
   the first electrode portion extended in a first direction; and
   the second electrode portion extended in a second direction, and
   wherein the plurality of touch lines comprise:
   first and second touch lines not overlapping with the first electrode portion of the plurality of touch electrodes; and a third touch line disposed between the first and second touch lines and overlapping with the second electrode portion.

18. The touch display device according to claim 17, wherein a line width of at least one of the first electrode portion, the first touch line, and the second touch line is less than a line width of the second electrode portion.

19. The touch display device according to claim 1, wherein at least three of at least one red subpixel, at least one green subpixel, at least one blue subpixel and at least one white subpixel constitute a unit pixel.

20. A touch display device comprising:
   a unit pixel disposed on a substrate and comprising a plurality of subpixels;
   a light-emitting element disposed at each of the plurality of subpixels;
   an encapsulation unit disposed on the light-emitting element;
   a touch electrode disposed on the encapsulation unit, the touch electrode formed in a mesh shape having at least one opening area;
   a touch line connected to the touch electrode; and
   a redundant electrode disposed in at least one opening area of the touch electrode and spaced apart from the touch electrode, wherein the redundant electrode is disposed along the touch line and overlaps with the touch line.

21. The touch display device according to claim 20, wherein the redundant electrode overlaps with a bank defining an emission area of the light-emitting element.

22. The touch display device according to claim 21, wherein the redundant electrode electrically floats.

23. The touch display device according to claim 21, wherein the redundant electrode is electrically connected to the touch line.

24. The touch display device according to claim 20, wherein the redundant electrode is made of a same material as the touch electrode and is disposed in a same plane as the touch electrode.

25. The touch display device according to claim 20, wherein the redundant electrode comprises:
   a plurality of first redundant electrodes overlapping with the touch line; and
   a plurality of second redundant electrodes overlapping with the touch electrode.

26. The touch display device according to claim 25, wherein the first redundant electrodes are made of a same material as the touch electrode and are disposed in a same plane as the touch electrode, and
   wherein the second redundant electrodes are made of a same material as the touch line and are disposed in a same plane as the touch line.

* * * * *